US011129310B2

(12) United States Patent
Arai

(10) Patent No.: US 11,129,310 B2
(45) Date of Patent: Sep. 21, 2021

(54) SEMICONDUCTOR MODULE, VEHICLE AND MANUFACTURING METHOD

(71) Applicant: FUJI ELECTRIC CO., LTD., Kanagawa (JP)

(72) Inventor: Nobuhide Arai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/664,927

(22) Filed: Oct. 27, 2019

(65) Prior Publication Data

US 2020/0170147 A1     May 28, 2020

(30) Foreign Application Priority Data

Nov. 22, 2018   (JP) .............................. JP2018-219562
Aug. 28, 2019   (JP) .............................. JP2019-156169

(51) Int. Cl.
   *H05K 7/20*           (2006.01)
   *H01L 25/07*          (2006.01)
   (Continued)

(52) U.S. Cl.
   CPC ......... *H05K 7/20927* (2013.01); *B60R 16/02* (2013.01); *H01L 25/072* (2013.01); *H02M 7/003* (2013.01); *H05K 7/20254* (2013.01); *H05K 7/20872* (2013.01); *H02M 7/5387* (2013.01)

(58) Field of Classification Search
CPC .. H05K 7/20263; H05K 7/205; H05K 1/0203; H05K 2201/066; H05K 7/20854; H01L 23/488; H01L 21/4871
See application file for complete search history.

(56) References Cited

U.S. PATENT DOCUMENTS 5,016,090 A  *   5/1991   Galyon ............... H01L 23/4336
                                                               257/714
5,504,378 A  *   4/1996   Lindberg .............. H02M 7/003
                                                              257/678

(Continued)

FOREIGN PATENT DOCUMENTS

JP             S632357 A      1/1988
JP          H08148617 A      6/1996
(Continued)

*Primary Examiner* — Stephen S Sul
*Assistant Examiner* — Michael A Matey

(57) ABSTRACT

A semiconductor module comprises a semiconductor apparatus and a cooling apparatus. The semiconductor apparatus includes a semiconductor chip and a circuit board. The cooling apparatus includes: a top plate; a side wall; a bottom plate; a coolant flow portion for causing a coolant to flow defined by the plates and the wall, where a cross section of the portion parallel to a principal surface of the top plate have a substantially rectangular shape with longer sides and shorter sides; an inlet associated with one direction along the shorter sides for letting a coolant into the portion; an outlet associated with another direction along the shorter sides for letting a coolant out of the portion; and a cooling pin fin arranged in the portion, extending between the top plate and the bottom plate, and having a substantially rhombic shape longer along the shorter sides than along the longer sides.

31 Claims, 16 Drawing Sheets

(51) Int. Cl.
*H02M 7/00* (2006.01)
*B60R 16/02* (2006.01)
*H02M 7/5387* (2007.01)

(56) References Cited

U.S. PATENT DOCUMENTS

| | | | | |
|---|---|---|---|---|
| 7,679,923 | B2 * | 3/2010 | Inagaki | H05K 5/061 |
| | | | | 361/752 |
| 10,561,040 | B1 * | 2/2020 | Lunsman | H05K 7/20272 |
| 2004/0070066 | A1 * | 4/2004 | Ogawa | H01L 25/072 |
| | | | | 257/691 |
| 2008/0237847 | A1 * | 10/2008 | Nakanishi | H01L 23/473 |
| | | | | 257/722 |
| 2009/0145581 | A1 * | 6/2009 | Hoffman | F28F 1/40 |
| | | | | 165/80.3 |
| 2010/0051234 | A1 | 3/2010 | Mori | |
| 2010/0172091 | A1 * | 7/2010 | Nishiura | H01L 23/473 |
| | | | | 361/689 |
| 2010/0193941 | A1 * | 8/2010 | Mori | H01L 23/473 |
| | | | | 257/712 |
| 2014/0043765 | A1 * | 2/2014 | Gohara | H05K 7/20927 |
| | | | | 361/699 |
| 2014/0054762 | A1 * | 2/2014 | Nagaune | H01L 23/473 |
| | | | | 257/714 |
| 2014/0196871 | A1 * | 7/2014 | Otsuka | H05K 7/20236 |
| | | | | 165/104.33 |
| 2014/0217608 | A1 * | 8/2014 | Takayama | H01L 23/4006 |
| | | | | 257/774 |
| 2014/0239486 | A1 * | 8/2014 | Gohara | F28F 9/026 |
| | | | | 257/714 |
| 2014/0252590 | A1 * | 9/2014 | Gohara | F28F 9/026 |
| | | | | 257/715 |
| 2014/0376184 | A1 * | 12/2014 | Gohara | H01L 23/473 |
| | | | | 361/689 |
| 2015/0008574 | A1 * | 1/2015 | Gohara | H01L 23/12 |
| | | | | 257/714 |
| 2015/0289356 | A1 * | 10/2015 | Izuo | H01L 23/13 |
| | | | | 361/709 |
| 2015/0351283 | A1 * | 12/2015 | Yamada | H01L 23/473 |
| | | | | 165/80.4 |
| 2015/0359142 | A1 | 12/2015 | Tanaka | |
| 2015/0380338 | A1 * | 12/2015 | Hori | H01L 23/49811 |
| | | | | 257/693 |
| 2016/0129792 | A1 * | 5/2016 | Gohara | B23P 15/26 |
| | | | | 310/54 |
| 2016/0133999 | A1 * | 5/2016 | Lee | H01M 10/613 |
| | | | | 429/120 |
| 2016/0190038 | A1 * | 6/2016 | Koyama | H01L 23/3675 |
| | | | | 257/693 |
| 2016/0293518 | A1 * | 10/2016 | Gohara | H01L 21/4871 |
| 2016/0343641 | A1 * | 11/2016 | Hori | H01L 24/11 |
| 2017/0164516 | A1 * | 6/2017 | Scolton | H01M 10/6556 |
| 2017/0263533 | A1 * | 9/2017 | Koyama | H01L 23/473 |
| 2017/0271240 | A1 * | 9/2017 | Inoue | H01L 25/18 |
| 2018/0024599 | A1 * | 1/2018 | Sakata | H01L 21/4878 |
| | | | | 361/679.47 |
| 2018/0204784 | A1 * | 7/2018 | Kawase | H01L 25/18 |
| 2018/0317342 | A1 * | 11/2018 | Gong | H01L 23/473 |
| 2019/0181717 | A1 * | 6/2019 | Zhou | H02K 11/33 |
| 2019/0335607 | A1 * | 10/2019 | Song | H05K 7/209 |
| 2019/0393133 | A1 * | 12/2019 | Asai | H05K 7/20827 |
| 2020/0144157 | A1 * | 5/2020 | Arai | H01L 23/473 |
| 2020/0187385 | A1 * | 6/2020 | Olesen | H01L 23/3736 |

FOREIGN PATENT DOCUMENTS

| | | | |
|---|---|---|---|
| JP | 2005166789 | A | 6/2005 |
| JP | 2010056131 | A | 3/2010 |
| JP | 2011071386 | A | 4/2011 |
| JP | 2011257015 | A | 12/2011 |
| JP | 2011258655 | A | 12/2011 |
| JP | 2013120897 | A | 6/2013 |
| JP | 5955651 | B2 | 7/2016 |
| JP | 2016201391 | A | 12/2016 |
| JP | 2018049861 | A | 3/2018 |
| JP | 6493612 | B1 | 4/2019 |
| WO | 2012157247 | A1 | 11/2012 |
| WO | 2014109235 | A1 | 7/2014 |

* cited by examiner

SEMICONDUCTOR MODULE, VEHICLE AND MANUFACTURING METHOD

The contents of the following Japanese patent applications are incorporated herein by reference:
NO. 2018-219562 filed on Nov. 22, 2018
NO. 2019-156169 filed on Aug. 28, 2019

BACKGROUND

1. Technical Field

The present invention relates to a semiconductor module, a vehicle and a manufacturing method.

2. Related Art

In the prior art, there are known semiconductor modules which include a plurality of semiconductor devices such as power semiconductor chips, and in which a cooling apparatus including cooling fins is mounted, (see Patent document 1-12 for example).

[Prior art document]

[Patent document]

| | |
|---|---|
| [Patent document 1] | U.S. Pat. No. 5,955,651 |
| [Patent document 2] | WO 2014/109235 |
| [Patent document 3] | Japanese Patent Application Publication No. 08-148617 |
| [Patent document 4] | Japanese Patent Application Publication No. 2018-049861 |
| [Patent document 5] | Japanese Patent Application Publication No. 2013-120897 |
| [Patent document 6] | Japanese Patent Application Publication No. 2016-201391 |
| [Patent document 7] | Japanese Patent Application Publication No. 63-02357 |
| [Patent document 8] | WO 2012/157247 |
| [Patent document 9] | Japanese Patent Application Publication No. 2010-056131 |
| [Patent document 10] | Japanese Patent Application Publication No. 2011-258655 |
| [Patent document 11] | Japanese Patent Application Publication No. 2011-071386 |
| [Patent document 12] | U.S. Pat. No. 6,493,612 |

SUMMARY

For the above-mentioned semiconductor modules, the efficiency of transferring heat generated by the plurality of semiconductor devices to a coolant passing close to the cooling fins is low.

To solve the above-mentioned problem, according to a first aspect of the present invention, provided is a semiconductor module including a semiconductor apparatus and a cooling apparatus. The semiconductor apparatus may include a semiconductor chip and a circuit board, where the semiconductor chip is mounted on the circuit board. The cooling apparatus may include a top plate, where the semiconductor apparatus is mounted on the top plate. The cooling apparatus may include a side wall connected to the top plate. The cooling apparatus may include a bottom plate connected to the side wall and facing the top plate. The cooling apparatus may include a coolant flow portion for causing a coolant to flow defined by the top plate, the side wall and the bottom plate, where a cross section of the coolant flow portion parallel to a principal surface of the top plate has a substantially rectangular shape with longer sides and shorter sides. The cooling apparatus may include an inlet in communication with a section associated with one direction along the shorter sides and for letting a coolant into the coolant flow portion. The cooling apparatus may include an outlet in communication with a section associated with another direction along the shorter sides and for letting a coolant out of the coolant flow portion. The cooling apparatus may include a cooling pin fin arranged in the coolant flow portion, extending between the top plate and the bottom plate, and having a substantially rhombic shape longer along the shorter sides than along the longer sides.

The coolant flow portion may include a fin region having the cooling pin fins, where a quantity of the cooling pin fins being greater along the longer sides than along the shorter sides, and having a substantially rectangular shape longer along the longer sides than along the shorter side. The coolant flow portion may include one communication region located at a greater position in the one direction than the fin region to be in communication with the inlet, and extending along the longer sides. The coolant flow portion may include another communication region located at a greater position in the other direction than the fin region to be in communication with the outlet, and extending along the longer sides.

Top plate may have a fastening portion located outside relative to the side wall for fastening to an external apparatus. A thickness of the fastening portion may be greater than a thickness of the fin region in the top plate.

A thickness of the side wall may be greater than a thickness of the fin region in the top plate.

The top plate, the side wall and the cooling pin fins may be integrally formed.

The bottom plate may have a stepped portion for setting a position at which the side wall is firmly fixed and in contact with at least two different surfaces of the side wall.

A thickness of the bottom plate may be greater than both the thickness of the top plate and the thickness of the side wall. The inlet and the outlet may be each formed in the bottom plate.

The side wall and the bottom plate may be firmly fixed with a fixing agent. A profile of the bottom plate may be located inside relative to a profile of the side wall. Corners in the profile of the bottom plate that are firmly fixed to the side wall may be chamfered to have a region for the fixing agent to form a fillet.

A length of each side of a substantially rhombic cross section of the cooling pin fins may range from 1.8 mm to 2.0 mm. Each corner of the substantially rhombic cross section may be rounded with a curvature radius ranging from 0.1 mm to 0.2 mm.

Corners at opposite ends of the substantially rhombic cross section of the cooling pin fins along the shorter sides may be rounded with a larger curvature radius than corners at opposite ends of the substantially rhombic cross section along the longer sides.

According to a second aspect of the present invention, provided is a semiconductor module including a semiconductor apparatus and a cooling apparatus. The semiconductor apparatus may include a semiconductor chip and a circuit board, where the semiconductor chip is mounted on the circuit board. The cooling apparatus may include a top plate, where the semiconductor apparatus is mounted on the top plate in a region of a substantially rectangular shape with longer sides and shorter sides. The cooling apparatus may include a side wall connected to the top plate. The cooling apparatus may include a bottom plate connected to the side wall and facing the top plate. The cooling apparatus may include a coolant flow portion for causing a coolant to flow defined by the top plate, the side wall and the bottom plate. The cooling apparatus may include an inlet in communication with a section associated with one direction along the shorter sides and for letting a coolant into the coolant flow portion. The cooling apparatus may include an outlet located opposite to the inlet in a diagonal direction of the region in a planar view, in communication with a section associated with another direction along the shorter sides and for letting the coolant out of the coolant flow portion. The cooling apparatus may include a cooling pin fin arranged in the coolant flow portion and extending between the top plate and the bottom plate. In the planar view, in an area associated with one way along the longer sides where the inlet is located, at least a part of an inner side of the side wall in the other direction along the shorter sides may be largely inclined inward compared to an inner side of the side wall in the one direction along the shorter sides.

The side wall may not overlap the semiconductor apparatus in the planar view.

A profile of the side wall may be approximately symmetric along the shorter sides about a central axis extending along the longer sides in the planar view. In the area associated with the one way along the longer side where the inlet is located, a thickness of at least a part of the side wall in the other direction may be greater than a thickness of the side wall in the one direction, so that the at least a part of the inner side of the side wall in the other direction may be largely inclined inward compared to the inner side of the side wall in the one direction.

The at least a part of the side wall in the other direction in the area associated with the one way along the longer side where the inlet is located may have, in a surface facing the bottom plate, either of a positioning pin designed to fit into a positioning hole formed in the bottom plate and a positioning hole into which a positioning pin formed on the bottom plate is designed to fit.

The side wall and the bottom plate may be firmly fixed with a fixing agent. The at least a part of the side wall in the other direction in the area associated with the one way along the longer side where the inlet is located may have a groove for holding the fixing agent in a surface facing the bottom plate.

A profile of the side wall may be approximately symmetric along the shorter side about a central axis extending along the longer side in the planar view. The side wall may have an outer wall forming the profile and surrounding the coolant flow portion. The side wall may have a slope portion located in the other direction in the area associated with the one way along the longer side where the inlet is located and contacting an inner surface of the outer wall. As the at least a part of the inner side of the side wall in the other direction, an inner side of the slope portion may be largely inclined inward compared to an inner side of the outer wall in the one direction.

The outer wall may be integrally formed with the top plate. The slope portion may be detachably fixed to the top plate.

The side wall may be integrally formed with the top plate. A thickness of the side wall may be approximately uniform. A profile of at least a part of the side wall in the other direction may be located inside relative to a profile of the bottom plate. The top plate may have a support pin for supporting the bottom plate outside the at least a part of the side wall in the other direction in an area associated with the one way along the longer side where the inlet is located. The side wall and the support pin may be firmly fixed to the bottom plate with a fixing agent.

In the planar view, the plurality of cooling pin fins, may have a substantially rhombic shape longer along the shorter sides than along the longer sides, and a straight line connecting one side of each of the plurality of cooling pin fins extends in the diagonal direction. In the planar view, the straight line extending between an area associated with another way along the longer sides where the outlet is located and associated with the one direction along the shorter sides and an area associated with the one way along the longer sides where the inlet is located and associated with the other direction along the shorter sides may intersect, at an angle of less than 90°, with an extending direction of the at least a part of an inner side of the side wall in the other direction in an area associated with the one way along the longer sides where the inlet is located.

A thickness of the bottom plate may be greater than both the thickness of the top plate and the thickness of the side wall. The inlet and the outlet may be each formed in the bottom plate.

According to a third aspect of the present invention, provided is a vehicle comprising the semiconductor module according to the first aspect.

According to a fourth aspect of the present invention, provided is a vehicle including the semiconductor module according to the second aspect; and a pump for letting a coolant into the coolant flow portion through the inlet and letting the coolant out of the coolant flow portion through the outlet of the semiconductor module. The semiconductor module may be secured inside the vehicle with the inlet placed on an upper side of a gravitational direction and the outlet placed on a lower side of a gravitational direction.

According to a fifth aspect of the present invention, provided is a manufacturing method of the semiconductor module according to the first aspect and the second aspect. In the manufacturing method, the top plate, the side wall and the cooling pin fins may be integrally formed out of a single continuous plate member.

The top plate, the side wall and the cooling pin fins may be integrally formed by performing on the plate member punching using molds corresponding to shapes of the top plate, the side wall and the cooling pin fins.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments should not to be construed as limiting the claimed invention. Also, all the combinations of the features described in the embodiments are not necessarily essential for means provided by aspects of the invention.

Figure 1:
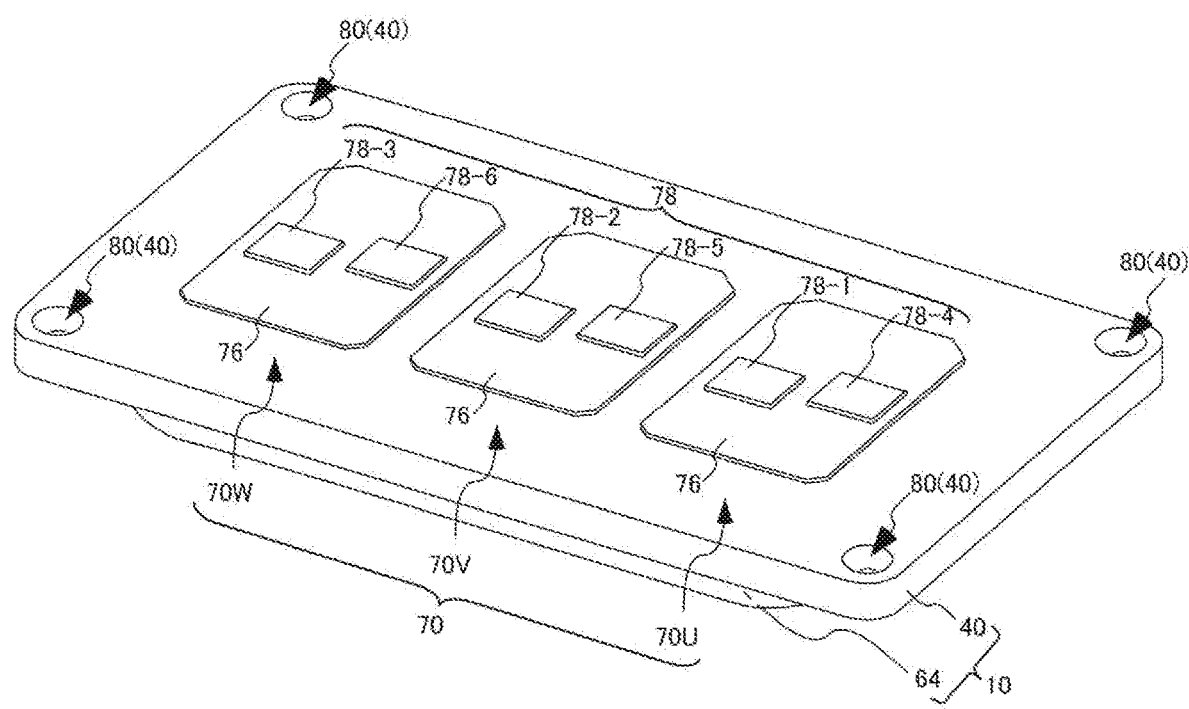
FIG. 1 is a schematic perspective view showing an example of a semiconductor module 100 according to one embodiment of the present invention.
Figure 2:
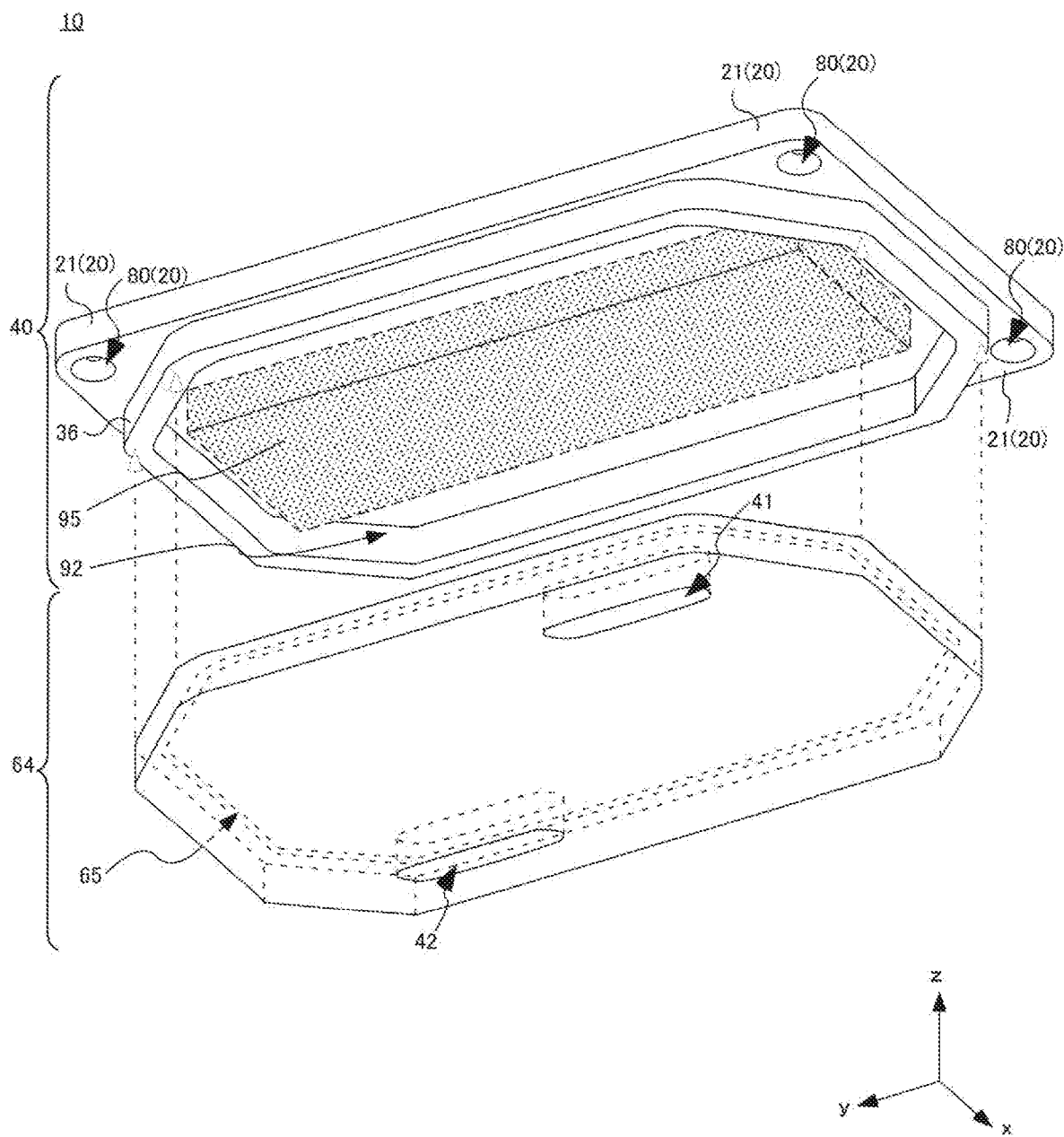
FIG. 2 is a schematic perspective view showing an example of a cooling apparatus 10 of the semiconductor module 100 according to one embodiment of the present invention.
Figure 3:
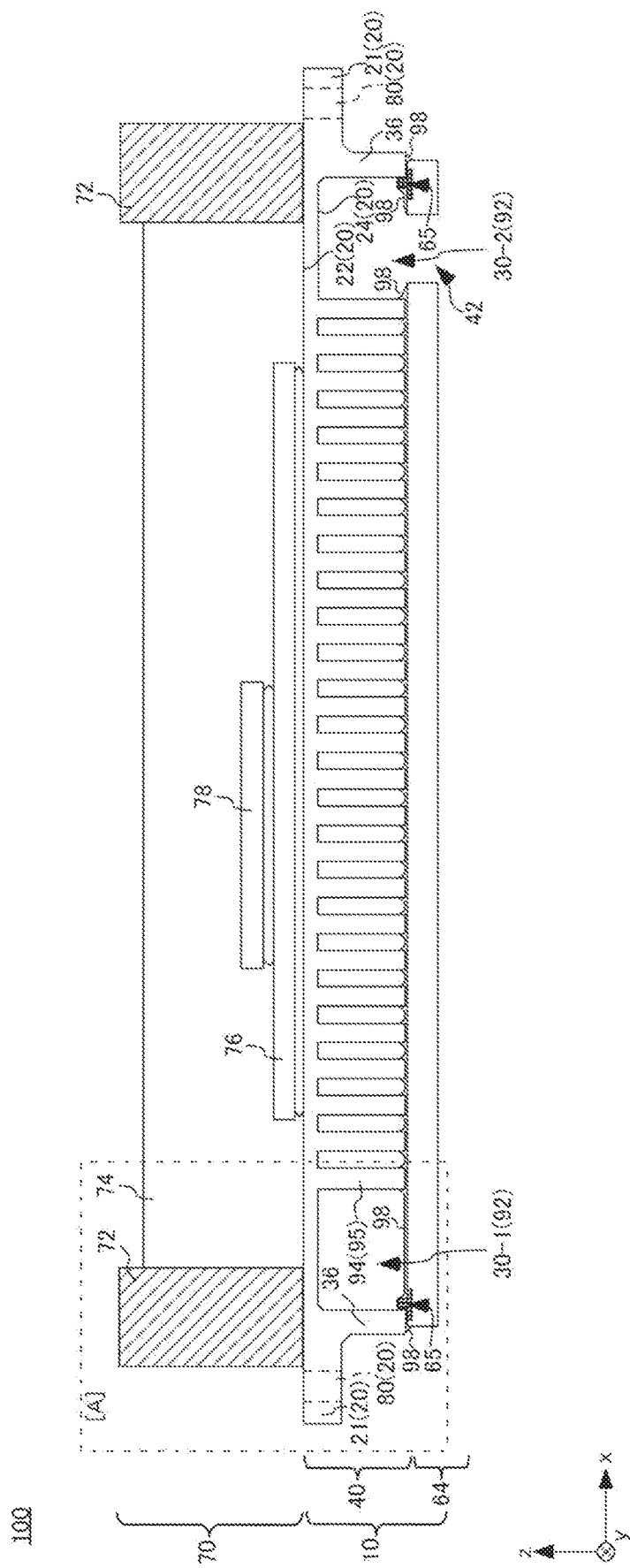
FIG. 3 is a schematic cross-sectional view showing an example of the semiconductor module 100 according to one embodiment of the present invention.
Figure 4:
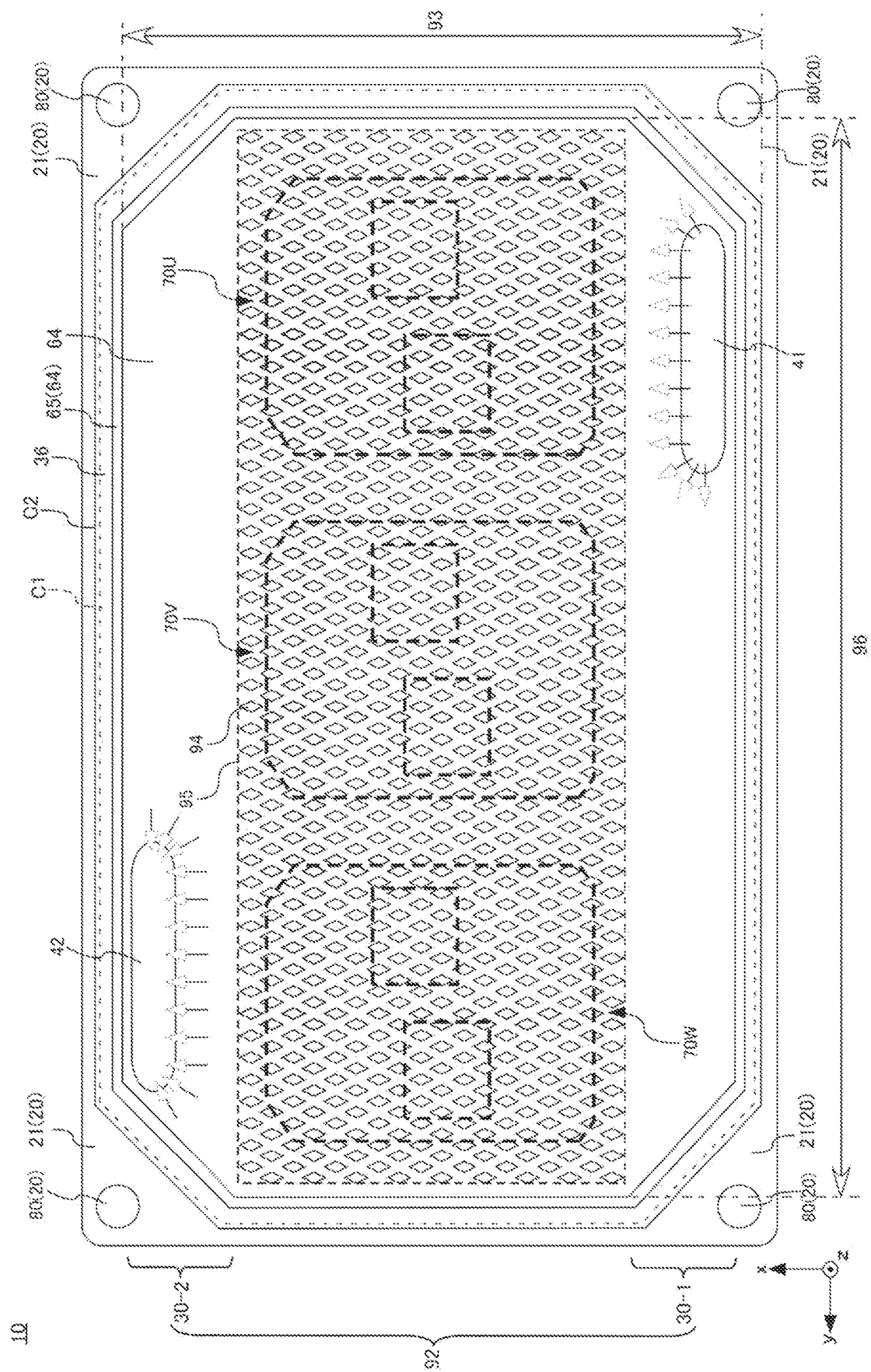
FIG. 4 is a diagram showing an example of the arrangement of a fin region 95 of the cooling apparatus 10 and a semiconductor apparatus 70, the shape of cooling pin fins 94, and the flow direction of a coolant in the semiconductor module 100 according to one embodiment of the present invention.

FIG. 1 is a schematic perspective view showing an example of a semiconductor module 100 according to one embodiment of the present invention, and FIG. 2 is a schematic perspective view showing an example of a cooling apparatus 10 of the semiconductor module 100. Further, FIG. 3 is a schematic cross-sectional view showing an example of the semiconductor module 100 according to one embodiment of the present invention, and FIG. 4 is a diagram showing an example of an arrangement of a fin region 95 of the cooling apparatus 10 and a semiconductor apparatus 70, the shape of the cooling pin fins 94, and the flow direction of a coolant in the semiconductor module 100 according to one embodiment of the present invention. FIG. 3 is a cross-sectional view obtained by imaginarily slicing through, in an x-z plane, both a semiconductor chip 78 of a U-phase unit 70U in the semiconductor module 100 shown in FIG. 1 and an outlet 42 of the cooling apparatus 10 shown in FIG. 2. In FIG. 4, the U-phase unit 70U, a V-phase unit 70V and a W-phase unit 70W shown in FIG. 1 are shown with dashed lines. The region [A] shown with a dashed line in FIG. 3 is a region enlarged and shown in FIG. 8 described below.

The semiconductor module 100 includes the semiconductor apparatus 70 and the cooling apparatus 10. The semiconductor apparatus 70 in this example is placed on the cooling apparatus 10. For description of this embodiment, a surface of the cooling apparatus 10 on which the semiconductor apparatus 70 is placed is an x-y plane, and an axis perpendicular to the x-y plane is a z axis. The x, y and z axes form a right-handed system. For description of this embodiment, a direction from the cooling apparatus 10 toward the semiconductor apparatus 70 along the z-axis is referred to as an upper direction and a direction opposite to the upper direction is referred to as a lower direction. The upper and lower directions are not limited to the gravitational direction. In addition, for description of this embodiment, among the surfaces of each member, a surface on the upper side is referred to as an upper surface, a surface on the lower side is referred to as a lower surface, and a surface between the upper surface and the lower surface is referred to as a side surface. For description of this embodiment, the planar view means a view of the semiconductor module 100 from the positive z-axis direction.

The semiconductor apparatus 70 includes the semiconductor chip 78 and a circuit board 76 on which the semiconductor chip 78 is mounted. The semiconductor apparatus 70 in this example may include three circuit boards 76 and each of the circuit boards 76 may have two semiconductor chips 78 mounted thereon. The semiconductor apparatus 70 on this example is a power semiconductor apparatus, and may include the U-phase unit 70U having the circuit board 76 and a semiconductor chip 78-1 and a semiconductor chip 78-4, the V-phase unit 70V having the circuit board 76 and a semiconductor chip 78-2 and a semiconductor chip 78-5, and the W-phase unit 70W having the circuit board 76 and a semiconductor chip 78-3 and a semiconductor chip 78-6. The semiconductor module 100 in this example may act as an apparatus which constitutes a three-phase AC inverter. Each semiconductor chip 78 of the U-phase unit 70U, the V-phase unit 70V and the W-phase unit 70W is a heat source which generates heat when the semiconductor module 100 operates.

The semiconductor chip 78 is a vertical semiconductor device, which has an upper-surface electrode and a lower-surface electrode. The semiconductor chip 78 includes a device formed on a semiconductor substrate of silicon or the like, such as an insulated-gate bipolar transistor (IGBT), MOS field effect transistor (MOSFET) and a free wheeling diode (FWD), for example. The semiconductor chip 78 may be a reverse conducting IGBT (RC-IGBT) in which the IGBT and the FWD are integrated on a single semiconductor substrate. In the RC-IGBT, the IGBT and the FWD may be in anti-parallel connection.

The lower-surface electrode of the semiconductor chip 78 is connected to an upper surface of the circuit board 76. The upper-surface electrode of the semiconductor chip 78 may be an emitter, source or anode electrode, and the lower-surface electrode may be a collector, drain or cathode electrode. The semiconductor substrate of the semiconductor chip 78 may be of silicon carbide (SiC) or gallium nitride (GaN).

The semiconductor chip 78 including a switching device such as the IGBT or the MOSFET has a control electrode. The semiconductor module 100 may include a control terminal connected to the control electrode of the semiconductor chip 78. The switching device can be controlled by an external control circuit via the control terminal.

For example, the circuit board 76 is a laminated substrate which includes an insulating plate having an upper surface and a lower surface, a circuit layer provided on the upper surface and a metal layer provided on the lower surface of the insulating plate in sequence. The circuit board 76 includes an upper surface and a lower surface, and the lower surface is arranged on an upper surface of the cooling apparatus 10. The circuit board 76 is fixed on the upper surface of the cooling apparatus 10, through a metal layer with solder or the like, for example. On the upper-surface side of the circuit board 76, for example, two semiconductor chips 78 are fixed through the circuit layer.

The circuit board 76 may be a DCB (Direct Copper Bonding) substrate or an AMB (Active Metal Brazing) substrate, for example. The insulating plate may be formed of a ceramic material such as alumina ($Al_2O_3$), aluminum nitride (AlN), silicon nitride ($Si_3N_4$). The circuit layer and the metal layer may be a plate including a conductive material such as copper or an alloy of copper. The circuit layer is fixed on the upper-surface side of the insulating plate via soldering, brazing or the like. The semiconductor chip 78 is electrically and mechanically connected via soldering or the like, that is, directly connected in a circuitry manner, to an upper surface of the circuit layer. The circuit layer may be electrically connected to other conductive members via wiring or the like.

The cooling apparatus 10 has a base plate 40 and a bottom plate 64. The base plate 40 includes a top plate 20 on which the semiconductor apparatus 70 is mounted, a side wall 36 connected to the top plate 20 and a plurality of cooling pin fins 94 connected to the top plate 20.

The top plate 20 is a plate-like member having a principal surface spreading in the x-y plane. The top plate 20 in this example has a substantially rectangular shape with longer sides and shorter sides in the planar view. The shorter sides of the top plate 20 in this example are parallel to the x axis and the longer sides parallel to the y axis. The top plate 20 includes a fastening portion 21 for fastening the semiconductor module 100 to an external apparatus for mounting. The fastening portion 21 has a penetration hole 80 which is located outside relative to the side wall 36 connected to the top plate 20 in the planar view, and into which a boss or the like of the external apparatus is inserted. The fastening portions 21 in this example have four penetration holes 80 in total at four respective corners of the top plate 20 of substantially rectangular shape.

The thickness of the side wall 36 is approximately uniform and constitutes the side surface of the cooling apparatus 10. The side wall 36 in this example has a substantially rectangular profile with longer sides and shorter sides in the x-y plane. Since the side wall 36 constitutes the side surface of the cooling apparatus 10, the shorter sides of the profile of the side wall 36 are parallel to the x axis and the longer sides are parallel to the y axis in the planar view. Further, the side wall 36 in this example is located inside relative to the fastening portion 21 of the top plate 20 in the planar view, and extends from the top plate 20 in the negative z-axis direction.

At least one of the plurality of cooling pin fins 94 has a substantially rhombic cross-sectional shape in the x-y plane. For the purpose of the description hereinafter, one or more cooling pin fins 94 can be referred to just as the cooling pin fins 94. The cooling pin fins 94 extend from the top plate 20 in the negative z-axis direction. The cooling pin fins 94 are located inside relative to the side wall 36 in the planar view, and surrounded by the side wall 36.

In the cooling apparatus 10 in FIG. 2, for simplicity, the fin region 95, the region in which the cooling pin fins 94 are provided, is shown with dots, instead of illustrating the cooling pin fins 94. The shape of the fin region 95 may be rectangular in the planar view, and the shorter sides and the longer sides of the fin region 95 may be parallel to the x axis and to the y axis, respectively.

The top plate 20, the side wall 36 and the cooling pin fins 94 of the base plate 40 in this example are integrally formed. For example, the top plate 20, the side wall 36 and the cooling pin fins 94 may be integrally formed out of a single continuous plate member. For example, the top plate 20, the side wall 36 and the cooling pin fins 94 may be integrally formed by performing on the single continuous plate member punching using molds corresponding to the shapes of the top plate 20, the side wall 36 and the cooling pin fins 94. In another example, the top plate 20, the side wall 36 and the cooling pin fins 94 may be integrally formed by molding using any forging method such as cold forging under an ordinary temperature environment which uses impact pressing or the like, or warm forging, hot forging and liquid metal forging under a high temperature environment, or casting. In this embodiment, the top plate 20, the side wall 36 and the cooling pin fins 94 of the semiconductor module 100 are integrally formed, so that the number of parts can be reduced compared to that in the embodiment of firmly fixing separately-formed parts to one another.

The bottom plate 64 is a plate-like member. The bottom plate 64 in this example has a substantially rectangular shape with longer sides and shorter sides in the planar view. The shorter sides of the bottom plate 64 in this example are parallel to the x axis and the longer sides are parallel to the y-axis. The bottom plate 64 constitutes the bottom surface of a coolant flow portion 92. The bottom plate 64 is connected to the side wall 36 and faces the top plate 20.

The coolant flow portion 92 for causing a coolant to flow is defined by the top plate 20, the side wall 36 and the bottom plate 64. In other words, the side wall 36 is arranged to surround the coolant flow portion 92 in the x-y plane, and the top plate 20 and the bottom plate 64 are arranged to face each other and sandwich the coolant flow portion 92 therebetween along the z-axis. As such, the profile of the coolant flow portion 92 in the x-y plane is defined by the inner circumference of the side wall 36, and the coolant flow portion 92 has a substantially rectangular shape with longer sides and shorter sides in the x-y plane.

In the bottom plate 64 in this example, formed are an inlet 41 which is a penetration hole for letting a coolant into the coolant flow portion 92 and an outlet 42 which is a penetration hole for letting a coolant out of the coolant flow portion 92. The bottom plate 64 in this example also has, for example, a stepped portion 65 on its surface facing the top plate 20 for setting a position at which the side wall 36 is firmly fixed, for example. In the planar view, a profile of the stepped portion 65 in this example is smaller than a profile of the bottom plate 64, and has a substantially rectangular shape with longer sides and shorter sides as with the bottom plate 64. The shorter sides of the stepped portion 65 in this example are parallel to the x axis and the longer sides are parallel to the y-axis. Instead of the stepped portion 65 illustrated in FIG. 2 to FIG. 4 and the like, the bottom plate 64 may have any other step capable of setting the position at which the side wall 36 is firmly fixed. Alternatively, the bottom plate 64 may not have the stepped portion 65. In addition to or instead of the stepped portion 65, the bottom plate 64 may have another structure for setting a position at which the side wall 36 is firmly fixed, for example, pins arranged at least three points in a surface of the bottom plate 64 that faces the side wall 36. The pins may abut the inner circumferential surface of the side wall 36, or may be inserted into holes that are provided in an end surface of the side wall 36 and have a complementary shape to the pins.

Pipes communicating with an external coolant supply source can be connected respectively to the inlet 41 and the outlet 42. In other words, the cooling apparatus 10 can be connected to the external coolant supply source via the two pipes. The cooling apparatus 10 can be therefore supplied with a coolant from one pipe through the inlet 41, the coolant circulates inside the coolant flow portion 92, and then the coolant can be carried to the other pipe through the outlet 42.

The inlet 41 and the outlet 42 are located in one section of the cooling apparatus 10 associated with one direction along the x-axis and in another section opposite to the one section, respectively, and located in one section of the cooling apparatus 10 associated with one direction along the y-axis and in another section opposite to the one section, respectively. In other words, the inlet 41 and the outlet 42 are located on diagonally opposite ends of the coolant flow portion 92, which has a substantially rectangular shape in the x-y plane.

In the semiconductor module 100 in this embodiment, heat generated by respective semiconductor chips 78 arrayed along the z-axis on the upper surface of the cooling apparatus 10 is efficiently cooled by a coolant, which flows into the coolant flow portion 92 through the inlet 41 of the cooling apparatus 10, spreads throughout the inside of the coolant flow portion 92 and flows out through the outlet 42.

As shown in FIG. 3, the top plate 20 has an upper surface (front surface) 22 and a lower surface (back surface) 24 which are parallel to the x-y plane. The top plate 20 is formed of metal, for example. As a more specific example, it is formed of metal including aluminum. A plating layer such as of nickel may be formed on the surface of the top plate 20. The semiconductor apparatus 70 is placed on the upper surface 22 of the top plate 20. In this case, the circuit board 76 of the semiconductor apparatus 70 may be directly fixed to the upper surface 22 of the top plate 20 via soldering or the like. Heat generated in the respective semiconductor chips 78 is transferred to the top plate 20. The top plate 20, the circuit board 76 and the semiconductor chips 78 are arranged in this order in the positive z-axis direction. The top plate 20 and the circuit board 76 may be thermally connected to each other, and so too with the circuit board 76 and the semiconductor chips 78. When the members of each of the pairs are soldered together, they are thermally connected via the solder.

The semiconductor apparatus 70 may additionally include an accommodating portion 72. The accommodating portion 72 is a frame formed of an insulating material such as, for example, a thermally curable resin and a UV curable resin, and may be provided to surround a region in which the circuit board 76 and others are arranged on the upper surface 22 of the top plate 20. The accommodating portion 72 may be bonded to the upper surface 22 of the top plate 20. The accommodating portion 72 has an internal space capable of accommodating the semiconductor chip 78, the circuit board 76 and other circuit elements. The accommodating portion 72 may accommodate respective components including the circuit board 76 and the semiconductor chip 78 of the semiconductor apparatus 70 in the internal space. The internal space of the accommodating portion 72 may be filled with a sealing portion 74 for sealing the semiconductor chip 78, the circuit board 76 and other circuit elements. The sealing portion 74 is an insulating member including a resin such as, for example, a silicone gel or an epoxy resin. For simplicity of description, illustration of the accommodating portion 72 and the sealing portion 74 is omitted in FIG. 1.

The coolant flow portion 92 is arranged to face the lower surface 24 of the top plate 20. As shown in FIG. 4, the coolant flow portion 92 has a substantially rectangular shape with longer sides 96 and shorter sides 93 in the cross section parallel to the principal surface of the top plate 20.

A coolant such as an LLC or water flows in the coolant flow portion 92. For the coolant flow portion 92, the coolant is let in through the inlet 41 associated with one direction along the shorter side 93 and let out through the outlet 42 associated with another direction along the shorter side 93. The coolant contacts the lower surface 24 of the top plate 20 on which the circuit board 76 is arranged and the cooling pin fins 94, and cool the semiconductor apparatus 70.

The coolant flow portion 92 may be a sealed space contacting each of the top plate 20, side wall 36 and the bottom plate 64. The bottom plate 64 is arranged directly or indirectly in close contact with a lower end of the side wall 36 in the negative z-axis direction, and the coolant flow portion 92 is sealed by the top plate 20, the side wall 36 and the bottom plate 64. The being indirectly in close contact refers to a state of the lower end of the side wall 36 being in close contact with the bottom plate 64 via a sealing material, adhesive material, a brazing material or a fixing agent 98 other than the foregoing materials provided between the lower end of the side wall 36 and the bottom plate 64. Being in close contact refers to a state where the coolant inside the coolant flow portion 92 does not leak through the close contact portion. The lower end of the side wall 36 and the bottom plate 64 are preferably brazed. The base plate 40 and the bottom plate 64 is formed of metal having the same composition, and the brazing material may be formed of metal including metal of which the melting temperature is lower than those of the base plate 40 and the other, for example, aluminum.

The cooling pin fins 94 are arranged in the coolant flow portion 92 and extend between the top plate 20 and the bottom plate 64. The cooling pin fins 94 in this example extend along the z-axis to be substantially orthogonal to the respective principal surfaces of the top plate 20 and the bottom plate 64. The cooling pin fins 94 in this example are arranged in a predetermined pattern in the x-y plane as shown in FIG. 4, and extend along the z-axis to be substantially orthogonal to the respective principal surfaces of the top plate 20 and the bottom plate 64. The cooling pin fins 94 in this example has a substantially rhombic shape longer along the shorter side 93 than along the longer side 96 of the coolant flow portion 92 in the x-y plane cross section. One of the pair of diagonals of the substantially rhombic shape that is parallel to the longer side 96 is shorter than the other diagonal parallel to the shorter side 93.

The cooling pin fins 94 each have an upper end and a lower end opposite to each other along the z-axis, are thermally and mechanically connected to the lower surface 24 of the top plate 20 at the upper end and extend from the lower surface 24 of the top plate 20 toward the coolant flow portion 92. When the cooling pin fins 94 are integrally formed with the top plate 20, the upper ends of the cooling pin fins 94 protrude from the lower surface 24 of the top plate 20 as a single piece, and extend from the lower surface 24 of the top plate 20 toward the coolant flow portion 92. The lower ends of the cooling pin fins 94 in this example are firmly fixed to the bottom plate 64 with the fixing agent 98.

The lower ends of the cooling pin fins 94 may be out of touch with the bottom plate 64. In the presence of a gap between the cooling pin fins 94 and the bottom plate 64, even if warpage or the like occurs on the bottom plate 64, stress is less likely to be generated between the cooling pin fins 94 and the bottom plate 64. Heat generated by each semiconductor chip 78 transfers to the coolant passing close to the cooling pin fins 94. In this manner, each semiconductor chip 78 is cooled.

As shown with a dashed line in FIG. 4, the fin region 95 of the coolant flow portion 92 has cooling pin fins 94 of which a quantity is greater along the longer side 96 than along shorter side 93 of the coolant flow portion 92, and has a substantially rectangular shape longer along the longer side 96 than along the shorter side 93. A quantity of the cooling pin fins 94 per unit length may be greater along the longer side 96 than along the shorter side 93 of the coolant flow portion 92. For example, in the fin region 95, the ratio between a quantity of the cooling pin fins 94 provided along the longer side 96 of the coolant flow portion 92 and a quantity of the cooling pin fins 94 along the shorter side 93 of the coolant flow portion 92 may within a predetermined range. The fin region 95 includes a region in which the cooling pin fins 94 are provided and flow paths among the cooling pin fins 94. As illustrated, in the fin region 95 in this example, the cooling pin fins 94 are arranged in a staggered manner. However, they may be squarely arrayed instead. A gap between adjacent cooling pin fins 94 may be smaller than the width of the cooling pin fin 94 itself. As shown in FIG. 4, the U-phase unit 70U, the V-phase unit 70V and the W-phase unit 70W in this example are all provided inside the fin region 95. However, some may be provided outside the fin region 95.

The coolant flow portion 92 has a first coolant flow channel 30-1 and a second coolant flow channel 30-2 arranged sandwiching the fin region 95 therebetween in the planar view. The coolant flow channels 30 refer to a space having a predetermined height (length along the z-axis) or more in the coolant flow portion 92. The predetermined height may be a distance between the top plate 20 and the bottom plate 64.

The first coolant flow channel 30-1 is located at a greater position in the one direction along the shorter side 93 than the fin region 95, is in communication with the inlet 41 and extends along the longer side 96. The second coolant flow channel 30-2 is located at a greater position in the other direction along the shorter side 93 than the fin region 95, is in communication with the outlet 42 and extends along the longer side 96. The direction the first and second coolant flow channels 30-1 and 30-2 extend can be translated as the direction along which the longer sides 96 of the fin region 95 lie. The first coolant flow channel 30-1 is an example of one communication region and the second coolant flow channel 30-2 is an example of another communication region.

As described above, when heat sources such as the plurality of semiconductor chips 78 are exist along the y-axis in the semiconductor apparatus 70 of the semiconductor module 100, if the main flow direction of the coolant used with the cooling apparatus 10 is parallel to the arrangement direction of the heat sources (which is along the y-axis), respective heat sources cannot be cooled uniformly. To address this, the arrangement configuration as in the semiconductor module 100 in this embodiment may be taken, of the main flow direction (positive x-axis direction) of the coolant used with the cooling apparatus 10 being orthogonal to the arrangement direction of the plurality of heat sources (which is along the y-axis). To be specific, with the semiconductor module 100 in this embodiment, the coolant flow portion 92 has a substantially rectangular shape with the longer sides 96 and the shorter sides 93 in a cross section (in the x-y plane) parallel to the principal surface of the top plate 20, and the coolant is let in through the inlet 41 associated with the one direction along the shorter side 93 (along the x-axis) and is let out through the outlet 42 associated with the other direction along the shorter side 93 (along the x-axis).

The cooling pin fins 94 are arranged in the cooling apparatus 10 to efficiently dissipate heat transferred from the plurality of heat sources, into the coolant flows within the coolant flow portion 92. When pin fins having a circular cross section (in the x-y plane) parallel to the principal surface of the top plate 20 are used with the cooling apparatus 10, the surface area of the pin fins allowed to contact the coolant is small, resulting in lower heat dissipation efficiency compared to when pin fins having a polygonal cross section (in the x-y plane) parallel to the principal surface of the top plate 20 are used. Further, even when pin fins having a polygonal cross section (in the x-y plane) parallel to the principal surface of the top plate 20 are used, if the cross section has a shape of square, regular hexagon or the like with a width in the main flow direction of a coolant in the x-y plane being equal to a width in the direction orthogonal to the flow direction, or a shape such as a rectangular shape with the width in the orthogonal direction being longer than the width in the flow direction, an area in a plane orthogonal to the flow direction is large and flow velocity loss of the coolant is large, resulting in low heat dissipation efficiency. In contrast, the cooling pin fins 94 arranged in the coolant flow portion 92 has a substantially rhombic shape longer along the shorter side 93 than along the longer side 96 of the coolant flow portion 92 in the x-y plane cross section, and therefore the area in the plane orthogonal to the main flow direction of the coolant is smaller for the semiconductor module 100 in this embodiment than for the above-mentioned polygonal pin fins in use, resulting in a small flow velocity loss of the coolant.

With the semiconductor module 100 in this embodiment having the above configuration, in the cooling apparatus 10 mounted to the semiconductor apparatus 70, the main flow direction of the coolant which flows within the coolant flow portion 92 having a substantially rectangular cross section in the x-y plane is a direction along the shorter side 93 of the substantially rectangular shape, and the x-y plane cross section of the cooling pin fins 94 arranged in the coolant flow portion 92 is a substantially rhombic shape longer in the main flow direction of the coolant. In this manner, with the semiconductor module 100 in this embodiment, the plurality of heat sources of the semiconductor apparatus 70 which generate heat while the semiconductor module 100 is in operation is uniformly cooled, and flow velocity loss of the coolant flowing inside the coolant flow portion 92 is lowered, so that the heat dissipation efficiency can be improved.

Further, with the semiconductor module 100 in this embodiment, the inlet 41 and the outlet 42 of the cooling apparatus 10 are located on diagonally opposite ends of the coolant flow portion 92, which has a substantially rectangular shape in the x-y plane.

The fin region 95 of the coolant flow portion 92 has cooling pin fins 94 of which the quantity is greater along the longer side 96 than along the shorter side 93 of the coolant flow portion 92, and has a substantially rectangular shape longer along the longer side 96 than along the shorter side 93. The coolant flow portion 92 has the first and second coolant flow channels 30-1 and 30-2 arranged to sandwich the fin region 95 therebetween in the planar view, and the first coolant flow channel 30-1 is located at a greater position in the one direction along the shorter side 93 than the fin region 95, is in communication with the inlet 41 and extends along the longer side 96. The second coolant flow channel 30-2 is located at a greater position in the other direction along the shorter side 93 than the fin region 95, is in communication with the outlet 42 and extends along the longer side 96.

With the semiconductor module 100 in this embodiment having such a configuration, once flowing into the coolant flow portion 92 through the inlet 41, the coolant heads toward the outlet 42 located diagonally opposite to the inlet 41 in the coolant flow portion 92 while spreading within the first coolant flow channel 30-1 so as to head not only along the shorter side 93 of the coolant flow portion 92 which is the main flow direction of the coolant but also along the longer side 96 of the coolant flow portion 92 orthogonal to the main flow direction of the coolant by colliding with the cooling pin fins 94 in the fin region 95, and then is let out through the outlet 42. With the semiconductor module 100 in this embodiment, the plurality of heat sources in the semiconductor apparatus 70 can be even more efficiently and uniformly cooled, which generate heat while the semiconductor module 100 is in operation, for this configuration than for an inlet and an outlet for the coolant located at opposite ends of the coolant flow portion 92 along the shorter side 93 of the coolant flow portion 92.

Figure 5:
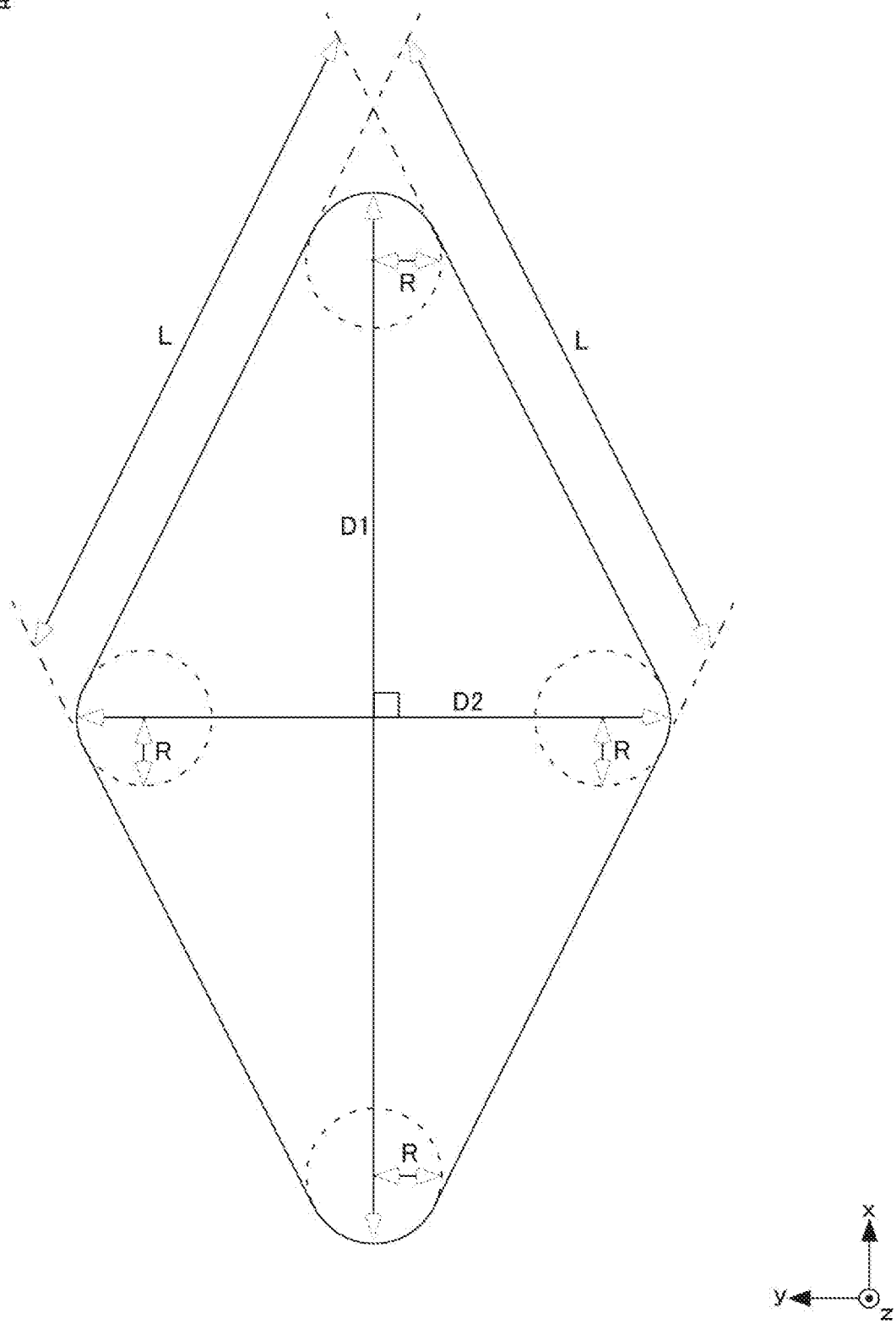
FIG. 5 is a diagram illustrating an example of the cross-sectional shape of the cooling pin fins 94 in an x-y plane.
Figure 6:
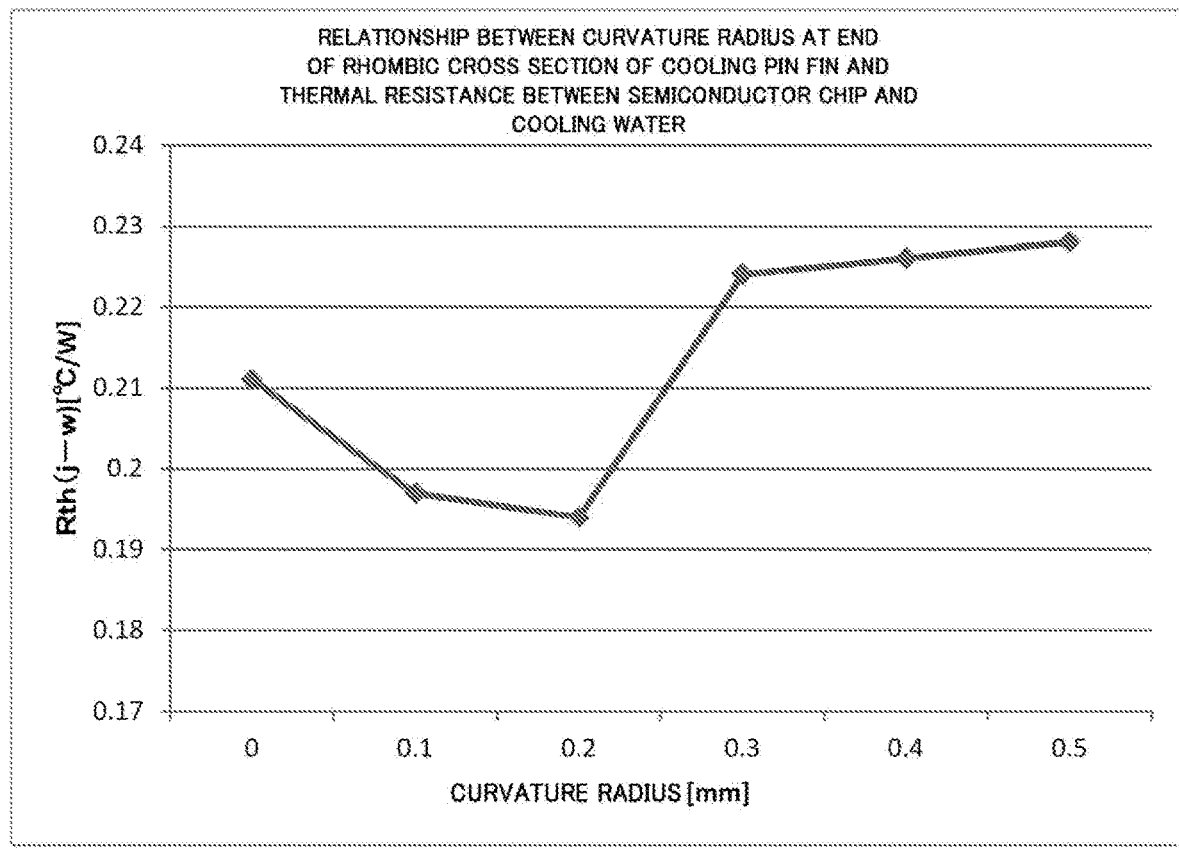
FIG. 6 is a graph showing a relationship between the R chamfering shape of the cooling pin fins 94 and the thermal resistance between a semiconductor chip 78 and cooling water.

FIG. 5 is a diagram illustrating an example of a cross-sectional shape of the cooling pin fins 94 in the x-y plane, and FIG. 6 is a graph showing the relationship between an R chamfering shape of the cooling pin fins 94 and a thermal resistance between the semiconductor chip 78 and cooling water. In FIG. 5, L is the length of one side of the cooling pin fins 94 having a substantially rhombic cross section in the x-y plane, and D1 is the length of the longer diagonal and D2 is the length of the shorter diagonal of the diagonals of the substantially rhombic shape extending along the x and y axes. The cooling pin fins 94 shown in FIG. 5 are processed such that respective corners in the cross section of the substantially rhombic shape in the x-y plane are R-chamfered to have the same curvature radius, and each curvature radius is shown as R. In FIG. 6, the horizontal axis of the graph indicates a curvature radius [mm] and the vertical axis indicates a thermal resistance Rth (j–w) (° C./W).

For example, the length L of each side of the substantially rhombic cross section of the cooling pin fins 94 in this example may range from 1.8 mm to 2.0 mm. For example, each corner of the substantially rhombic cross section of the cooling pin fins 94 in this example may be rounded with the curvature radius R ranging from 0.1 mm to 0.2 mm. As shown in the graph of FIG. 6, it has emerged clearly from the simulation that the thermal resistance Rth (j–w) (° C./W) between the semiconductor chip 78 and the cooling water significantly decreases from 0.211° C./W to 0.197° C./W as the curvature radius R of the corners of the cooling pin fins 94 changes from 0.0 mm to 0.1 mm, further decreases to 0.194° C./W as the curvature radius R changes from 0.1 mm to 0.2 mm, and significantly increases to 0.224° C./W as the curvature radius R changes from 0.2 mm to 0.3 mm.

Figure 7:
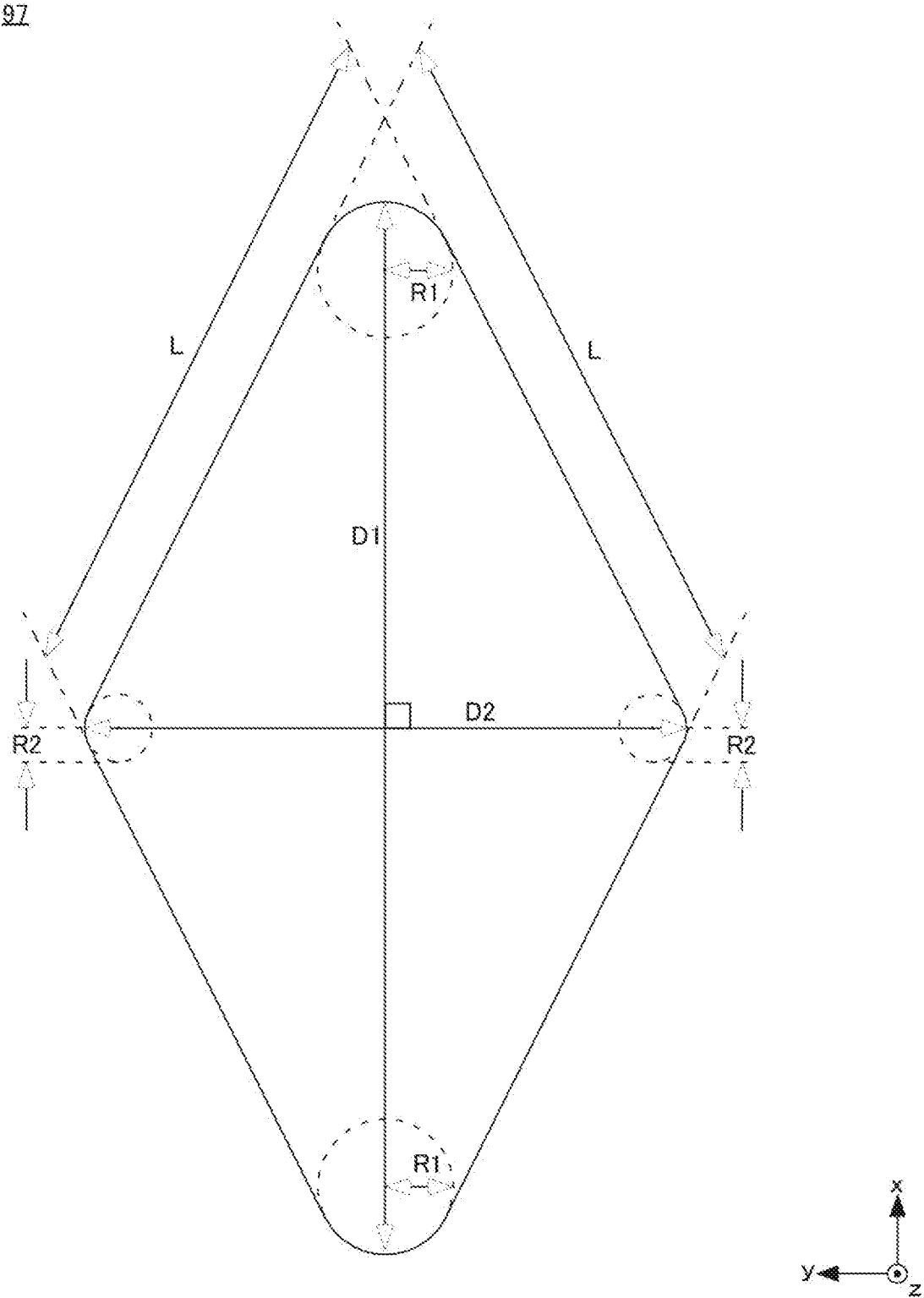
FIG. 7 is a diagram illustrating another example of the cross-sectional shape of the cooling pin fins 94 in the x-y plane.

FIG. 7 is a diagram illustrating another example of the cross-sectional shape of the cooling pin fins 94 in the x-y plane. The difference of the x-y plane cross-sectional shape of the cooling pin fins 94 in this example from the cooling pin fins 94 shown in FIG. 5 is as follows: corners at both ends of the substantially rhombic cross section along the shorter side 93 (along the x-axis) are rounded with a larger curvature radius (or a smaller curvature) than the corners at both ends of the substantially rhombic cross section along the longer side 96 (along the y-axis).

Compared to configuration of the uniform curvature radius R for all corners, the configuration as shown in this example can further reduce the flow velocity loss in some cases, where the corners at both ends in the main flow direction (along the x-axis) of the coolant within the coolant flow portion 92 have relatively rounded shape in the substantially rhombic x-y plane cross section of the cooling pin fins 94.

Figure 8:
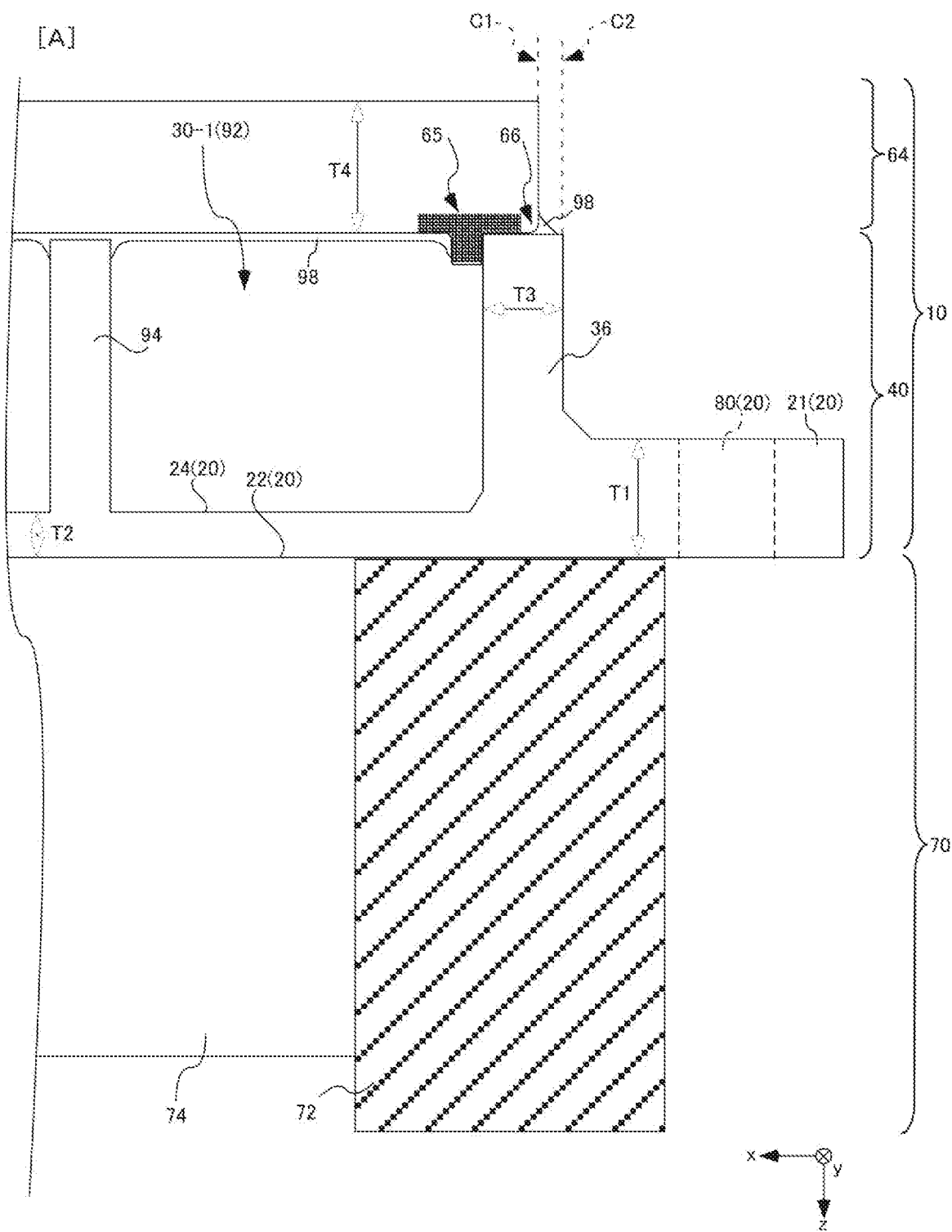
FIG. 8 is an enlarged partial view of a region A in FIG. 3.

FIG. 8 is an enlarged partial view of a region A in FIG. 3. Note that FIG. 8 shows the view after rotating the region A in FIG. 3 through 180 degrees. In FIG. 8, the thickness of the fastening portion 21 of the top plate 20 along the z-axis is shown as T1, the thickness of the top plate 20 in the fin region 95 along the z-axis is shown as T2, the thickness of the side wall 36 along the x-axis is shown as T3, and the thickness of the bottom plate 64 along the z-axis is shown as T4.

As shown in FIG. 8, the thickness T1 of the fastening portion 21 may be greater than the thickness T2 of the top plate 20 in the fin region 95 for the cooling apparatus 10 in this example. Reducing the thickness of the top plate 20 in the fin region 95 can cause heat from the semiconductor apparatus 70 arranged on the upper surface 22 of the top plate 20 to efficiently transfer into the coolant flowing within the coolant flow portion 92, while enhancing the strength of the fastening portion 21 can prevent the fastening portion 21 from breaking due to the strong fastening power which may be applied when the semiconductor module 100 is firmly fastened to an external apparatus with bolts or the like.

The thickness T3 of the side wall 36 may be greater than the thickness T2 of the top plate 20 in the fin region 95. Reducing the thickness of the top plate 20 in the fin region 95 can improve cooling efficiency in the same manner as above, while enhancing the strength of the side wall 36 connected to the top plate 20 can prevent the occurrence of deformation such as distortion or the like on a part of the top plate 20 corresponding to the fin region 95 due to the mechanical or thermal influence.

The thickness T4 of the bottom plate 64 may be greater than both the thickness T2 of the top plate 20 at least in the fin region 95 and the thickness T3 of the side wall 36, and may also greater than the thickness T1 of the fastening portion 21 of the top plate 20. As described above, the inlet 41 and the outlet 42 are both formed in the bottom plate 64. The strength of the cooling apparatus 10 can be enhanced and facilitate processing of the cooling apparatus 10 by forming the inlet 41 and the outlet 42 which are penetration holes in the bottom plate 64 which is the thickest.

In FIG. 8 and the above-described FIG. 4, the profile of the bottom plate 64 in the planar view is shown as C1 and the profile of the side wall 36 is shown as C2. The profile C1 of the bottom plate 64 may be located inside relative to the profile C2 of the side wall 36 for the cooling apparatus 10 in this example.

The stepped portion 65 in this example protrudes from the principal surface of the bottom plate 64, and has a profile which is slightly smaller than the inner circumference of the side wall 36 and approximately coincides with the inner circumference of the side wall 36 in the planar view. In this manner, the stepped portion 65 contacts with at least two different surfaces of the side wall 36 when firmly fixing the bottom plate 64 and the side wall 36 together, and acts to set a position for firmly fixing the side wall 36 to the bottom plate 64.

In addition, those of the corners of the bottom plate 64 in this example that are firmly fixed to the side wall 36 in the profile in the planar view may be chamfered. In the description below, the chamfered places in the bottom plate 64 may be referred to as chamfered portions 66. When the bottom plate 64 and the side wall 36 are firmly fixed together with the fixing agent 98 such as a brazing material or the like, the brazing material possibly overflows out of the firmly fixed region. In contrast, by performing chamfering such that the bottom plate 64 has the chamfered portions 66 as described above and firmly fixing the bottom plate 64 and the side wall 36 together with the bottom plate 64 placed above the side wall 36 in the gravitational direction as shown in the figure until the fixing agent 98 sets, a region in which the fixing agent 98 forms a fillet is created, successfully avoiding the overflow of the brazing material.

The chamfered portions 66 may be C-chamfered or R-chamfered. For the similar purpose, corners of the lower ends of the side wall 36 and the cooling pin fins 94 in the negative z-axis direction may be chamfered.

Figure 9:
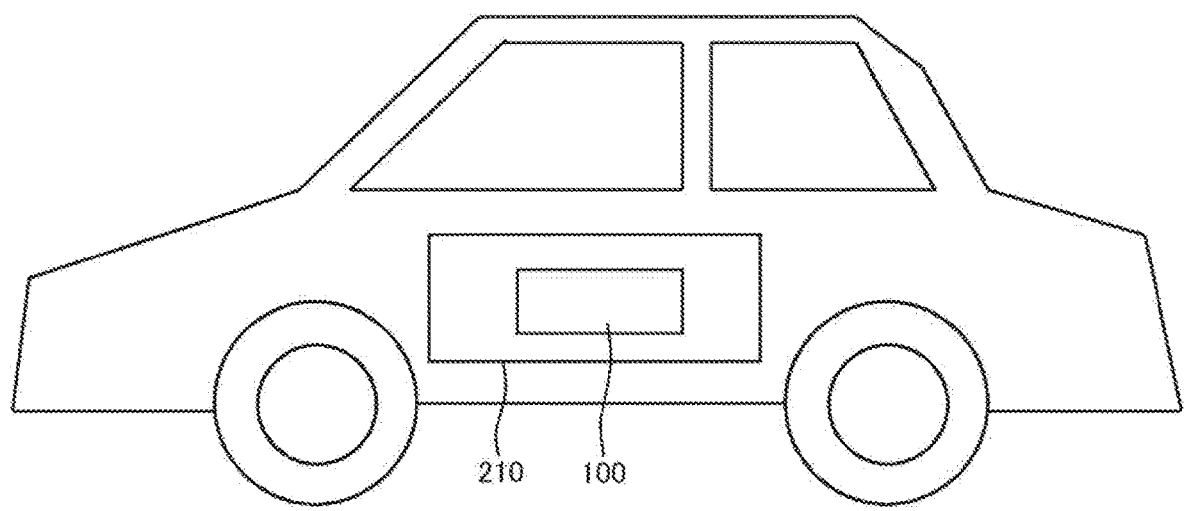
FIG. 9 schematically shows a vehicle 200 according to one embodiment of the present invention.

FIG. 9 schematically shows a vehicle 200 according to one embodiment of the present invention. The vehicle 200 is a vehicle which uses electrical power to generate at least part of thrust. For example, the vehicle 200 is an electric vehicle in which an electrically-driven device such as a motor generates all of thrust, or a hybrid vehicle which uses an electrically-driven device such as a motor in conjunction with an internal combustion engine driven by fuel such as gasoline.

The vehicle 200 includes a control apparatus 210 (an external apparatus) configured to control an electrically-driven device such as a motor. The control apparatus 210 is provided with the semiconductor module 100. The semiconductor module 100 may control electrical power to be supplied to the electrically-driven device.

Figure 10:
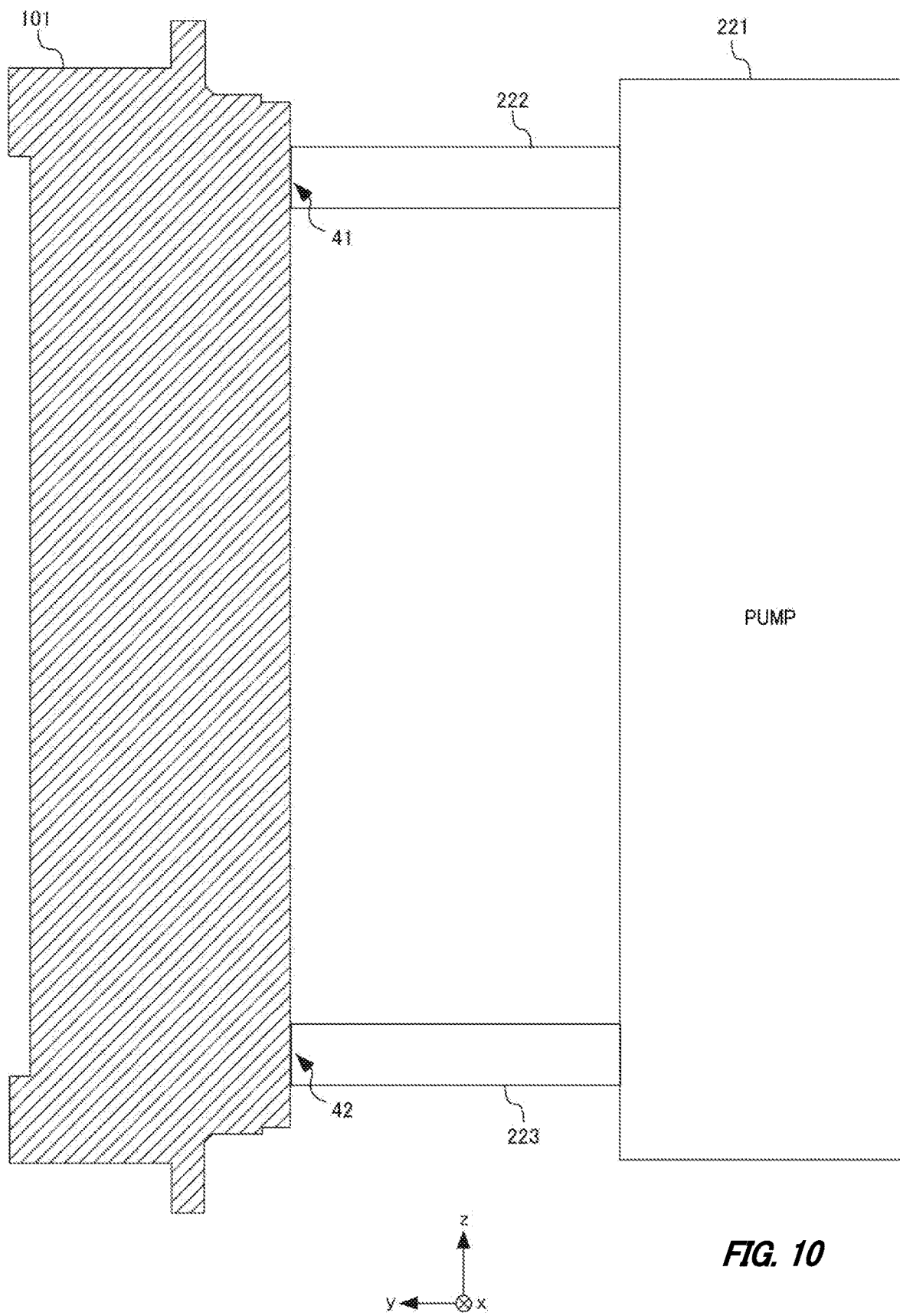
FIG. 10 is a schematic side view showing an example of a pump 221 and a semiconductor module 101 connected to the pump 221 via an inlet pipe 222 and an outlet pipe 223 inside the vehicle 200 according to one embodiment of the present invention.

FIG. 10 is a schematic side view showing an example of a pump 221 and a semiconductor module 101 connected to the pump 221 via an inlet pipe 222 and an outlet pipe 223 inside the vehicle 200 according to one embodiment of the present invention. The semiconductor module 101 according to this embodiment has components similar to those of the semiconductor module 100 according to the embodiments described using FIGS. 1 to 9. Therefore, among components included in the semiconductor module 101, for components similar to those of the semiconductor module 100, like reference numbers are used and the overlapped description is omitted.

Note that for the semiconductor module 101 in this embodiment, a surface of the cooling apparatus 10 on which the semiconductor apparatus 70 is placed is an x-z plane, and an axis perpendicular to the x-z plane is a y axis. In other words, the attitude of the semiconductor module 101 in this embodiment in the x-y-z space is the one after the semiconductor module 100 according to the embodiments described using FIGS. 1 to 9 is rotated about the x-axis through 90 degrees. As such, extending directions or the like of respective components of the semiconductor module 101 in this embodiment are different from the extending directions or the like of the similar components of the semiconductor module 100 in the embodiments described using FIGS. 1 to 9.

In this embodiment, the vehicle 200 includes the pump 221 and the semiconductor module 101. The pump 221 is configured to circulate the coolant in the vehicle 200, let the coolant into the coolant flow portion 92 through the inlet 41 and let the coolant out of the coolant flow portion 92 through the outlet 42 of the semiconductor module 101.

The semiconductor module 101 can be used with the inlet 41 installed on the upper side of the gravitational direction and the outlet 42 installed on the lower side of the gravitational direction at the convenience of the vehicle 200 to which the semiconductor module 101 is mounted or a user, or the like. The semiconductor module 101 shown in FIG. 10 is secured inside the vehicle 200 such that, for example, the inlet 41 is placed on the upper side along the z-axis and the outlet 42 is placed on the lower side along the z-axis, that is, such that the semiconductor module 101 is vertically placed so as to let in the coolant from above.

When the semiconductor module 100 according to the embodiments described using FIGS. 1 to 9 is used such that it is generally vertically placed so as to let in the coolant from above, air can accidentally accumulate within the coolant flow portion 92 of the cooling apparatus 10. That may be because, for example, air is contained in the pump 221, which supplies the semiconductor module 100 with the coolant, replacement of the coolant circulating between the semiconductor module 100 and the pump 221 causes air to enter, and so on. Since air has poor thermal conductivity compared to a coolant, heat dissipation efficiency of the semiconductor apparatus 70 decreases at the place where air accumulates and the temperature of the semiconductor apparatus 70 can rise to high degrees.

It is proved by experiment that when the semiconductor module 100 is vertically placed perpendicular to the horizontal plane, and thus water is let into the cooling apparatus 10 from above with the surface of the cooling apparatus 10 on which the semiconductor apparatus 70 is placed being the x-z plane, air is most likely to accumulate in the coolant flow portion 92. It is also proved from the flow analysis for the coolant let into the cooling apparatus 10 from the pump 221 with the semiconductor module 100 installed in the same manner as the experiment, that when the flow rate of water supplied to the cooling apparatus 10 of the semiconductor module 100 from the pump 221 is 5 (1/min) or less, the flow velocity of the water exhibits the largest decrease in the vicinity of the side wall 36 of the second coolant flow channel 30-2 in an area within the coolant flow portion 92 associated with one way along the longer side 96 where the inlet 41 is located.

For example, when the pump 221 is used inside the vehicle 200, the output of the pump 221 can be preferably as small as 5 (1/min). Also, for example, when the pump 221 is used inside the vehicle 200, even if the specification output of the pump 221 is 6 (1/min) or more, decrease in the ambient temperature causes increase in viscosity of the coolant to be circulated, resulting in an output of as small as 5 (1/min) in some cases.

Figure 11:
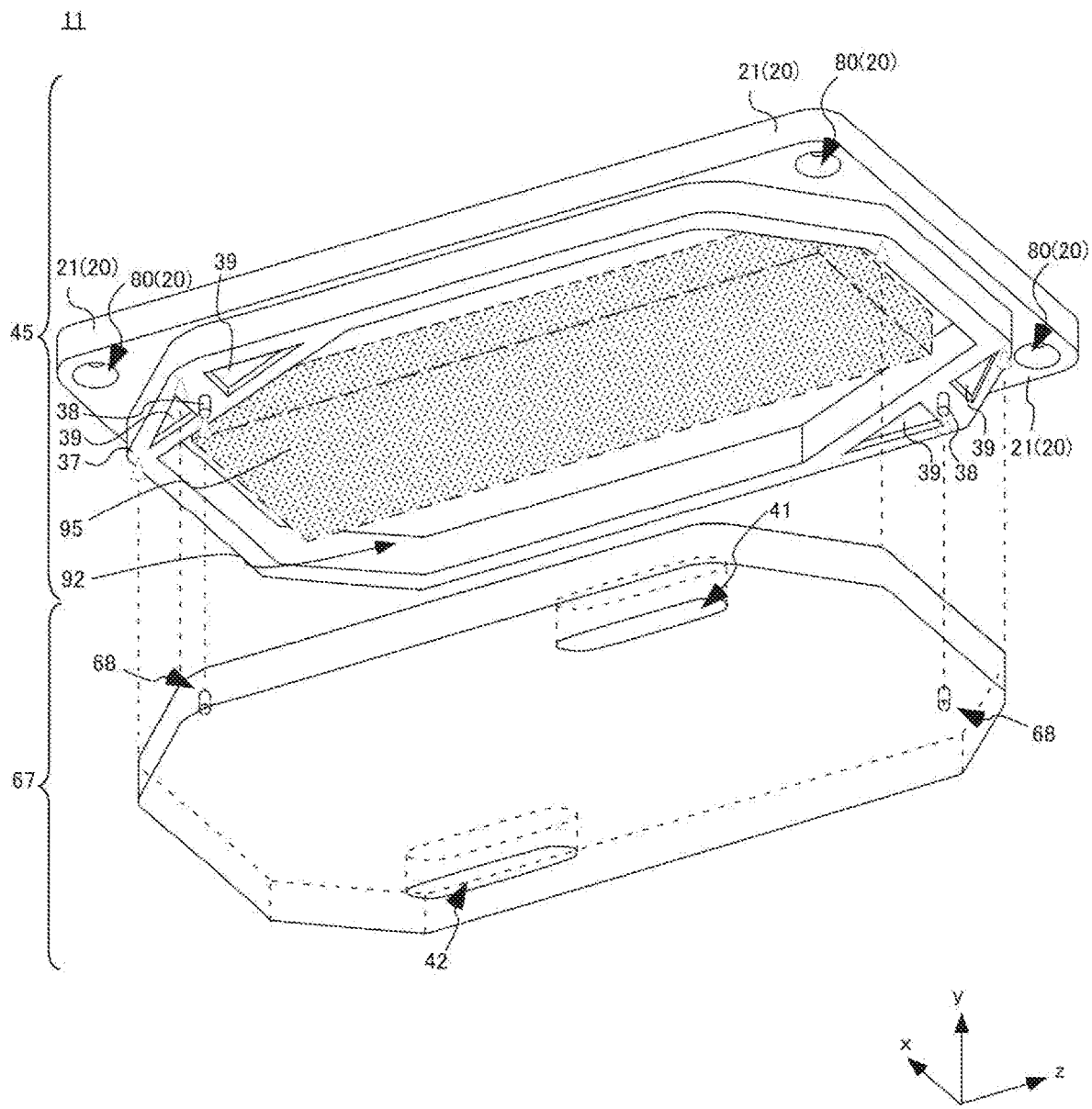
FIG. 11 a schematic perspective view showing an example of a cooling apparatus 11 of the semiconductor module 101 according to one embodiment of the present invention.
Figure 12:
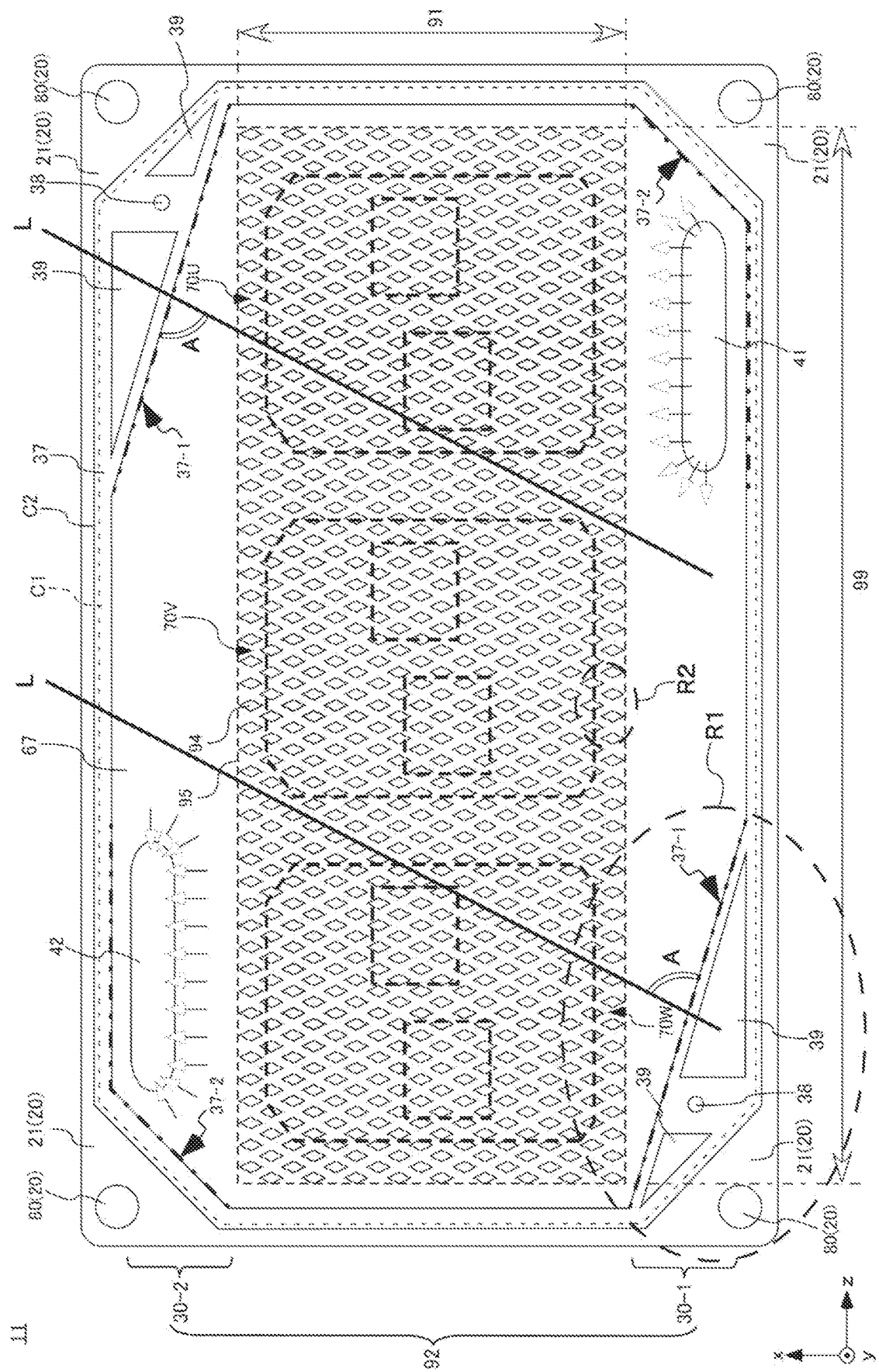
FIG. 12 is a diagram illustrating an example of the configuration of a side wall 37 of the cooling apparatus 11 in the semiconductor module 101 according to one embodiment of the present invention.

FIG. 11 a schematic perspective view showing an example of the cooling apparatus 11 of the semiconductor module 101 according to one embodiment of the present invention. Further, FIG. 12 is a diagram illustrating an example of the configuration of a side wall 37 of the cooling apparatus 11 in the semiconductor module 101 according to one embodiment of the present invention.

As with FIG. 2, for simplicity, in the cooling apparatus 11 in FIG. 11, the fin region 95, the region in which the cooling pin fins 94 are provided, is shown with dots, instead of illustrating the cooling pin fins 94. In addition, a region "R1" shown with a dashed line in FIG. 12 corresponds to a region enlarged and shown in each of FIG. 13 and FIG. 14 described below, and a region "R2" shown with a dashed line in FIG. 12 corresponds to a region enlarged and shown in FIG. 15. Furthermore, as with FIG. 4, the U-phase unit 70U, the V-phase unit 70V and the W-phase unit 70W are shown with dashed lines in FIG. 12.

Different from the semiconductor module 100 according to the above-mentioned embodiments, the semiconductor module 101 in this embodiment includes a cooling apparatus 11 instead of the cooling apparatus 10. Different from the cooling apparatus 10, the cooling apparatus 11 has a base plate 45 including a side wall 37 instead of having the base plate 40 including the side wall 36. The cooling apparatus 11 is also different from the cooling apparatus 10 in that it has a bottom plate 67 instead of the bottom plate 64.

Similar to the fin region 95 according to the embodiments described using FIGS. 1 to 9, the fin region 95 in this embodiment may have a rectangular shape in the planar view. For description of this embodiment, the planar view means a view of the semiconductor module 101 from the positive y-axis direction. The fin region 95 in this embodiment has longer sides 99 parallel to the z axis and shorter sides 91 parallel to the x axis in the cross section parallel to the principal surface of the top plate 20.

In the planar view, similar to the embodiments described using FIGS. 1 to 9, the U-phase unit 70U, the V-phase unit 70V and the W-phase unit 70W in this example is all provided inside the fin region 95. In other words, the semiconductor apparatus 70 is mounted inside a region on the top plate 20 that overlaps the fin region 95 in the planar view. The region on the top plate 20 in the planar view is an example of a region having a substantially rectangular shape with longer sides and shorter sides. The diagonal directions of the region approximately coincide with those of the coolant flow portion 92.

In the planar view, the substantially rectangular region having the longer sides and the shorter sides may be a rectangular region having a profile exactly surrounding the three units in this example, the U-phase unit 70U, the V-phase unit 70V and the W-phase unit 70W. In this case, in the planar view, the length of the rectangular region along the z-axis is equal to the length from a side of the U-phase unit 70U closer to the outside to a side of the W-phase unit 70W closer to the outside along the z-axis, and the length of the rectangular region along the x-axis is equal to the length of the U-phase unit 70U or the others along the x-axis.

The planar-view shape of the side wall 37 in this embodiment in the planar view is different from that of the side wall 36 in the cooling apparatus 10. To be specific, in the planar view, at least a part of the inner side of the side wall 37 facing the second coolant flow channel 30-2 is largely inclined inward compared to the inner side of the side wall 37 facing the first coolant flow channel 30-1 in an area associated with one way along the longer side 99 where the inlet 41 is located.

To be more specific, as shown in FIG. 12, the side wall 37 in this embodiment has a substantially rectangular profile in the x-z plane. In other words, the profile of the side wall 37 is approximately symmetric along the shorter side 91 about the central axis extending along the longer side 99 in the planar view. Further, as shown in FIG. 12, in the planar view, the thickness of at least a part of the side wall 37 facing the second coolant flow channel 30-2 is greater than the thickness of the side wall 37 facing the first coolant flow channel 30-1 in the area associated with the one way along the longer side 99 where the inlet 41 is located.

In this manner, in the planar view, at least a part of the inner side of the side wall 37 facing the second coolant flow channel 30-2 is largely inclined inward compared to the inner side of the side wall 37 facing the first coolant flow channel 30-1 in the area associated with the one way along the longer side 99 where the inlet 41 is located. The cross-sectional shape of the side wall 37 along the shorter side 91 in the area associated with the one way along the longer side 99 where the inlet 41 is located is asymmetric about the central axis extending along the longer side 99.

Note that the side wall 37 facing the second coolant flow channel 30-2 in the area associated with the one way along the longer side 99 where the inlet 41 is located is an example of a side wall associated with another direction along the shorter side (which is also referred to as "a second side wall"), and the side wall 37 facing the first coolant flow channel 30-1 is an example of a side wall associated with one direction along the shorter side (which is also referred to as "a first side wall"). The state where the side wall 37 is relatively largely inclined inward may mean a state where the side wall 37 is relatively very close to the fin region 95, may mean a state where the degree of reduction of the width of the first coolant flow channel 30-1 or the second coolant flow channel 30-2 by the side wall 37 is relatively large, or may mean a state where the degree of closeness of the side wall 37 to the fin region 95 is relatively large. In the planar view, the inclination may be associated with the included angle between the direction along the shorter side and the extending direction of the side wall (which is less than 90 degrees), and a large inclination may mean a relatively large included angle.

For description below, at least a part of the side wall 37 facing the second coolant flow channel 30-2 in the area associated with the one way along the longer side 99 where the inlet 41 is located may be referred to as a slope surface 37-1. Also, the side wall 37 facing the first coolant flow channel 30-1 in the area associated with the one way along the longer side 99 where the inlet 41 is located may be referred to as a non-slope surface 37-2.

As shown in FIG. 12, for example, in the planar view, at least a part of the thickness of the side wall 37 in this embodiment facing the first coolant flow channel 30-1 is greater than the thickness of the side wall 37 facing the second coolant flow channel 30-2, in an area associated with the other way along the longer side 99 where the outlet 42 is located. In this manner, in the planar view, at least a part of the inner side of the side wall 37 facing the first coolant flow channel 30-1 in the area associated with the other way along the longer side 99 where the outlet 42 is located is largely inclined inward compared with the inner side of the side wall 37 facing the second coolant flow channel 30-2.

For description below, at least a part of the side wall 37 facing the first coolant flow channel 30-1 in the area associated with the other way along the longer side 99 where the outlet 42 is located may be referred to as a slope surface 37-1. Also, the side wall 37 facing the second coolant flow channel 30-2 in the area associated with the other way along the longer side 99 where the outlet 42 is located may be referred to as a non-slope surface 37-2.

In FIG. 12, the slope surfaces 37-1 located at two different positions of the side wall 37 and the non-slope surfaces 37-2 located at two different positions of the side wall 37 are each shown with dashed lines. As shown in FIG. 12, the slope surfaces 37-1 located at two different positions of the side wall 37 both may have about the same dimension and shape. In other words, the two slope surfaces 37-1 both may have about the same inclination angle and about the same length.

As shown in FIG. 12, in the planar view, the plurality of cooling pin fins 94 have a substantially rhombic shape longer along the shorter side 91 than along the longer side 99, and a straight line connecting one side of each of the plurality of cooling pin fins 94 extends diagonally in the fin region 95. In FIG. 12, two of a plurality of straight lines L extending diagonally are shown, which extend between an area that is associated with the other way along the longer side 99 where the outlet 42 is located and that is associated with the first coolant flow channel 30-1 to an area that is associated with the one way along the longer side 99 where the inlet 41 is located and that is associated with the second coolant flow channel 30-2.

In this embodiment, in the planar view, one of the two straight lines L intersects with the extending direction of the slope surface 37-1 in the area associated with the one way along the longer side 99 where the inlet 41 is located at an angle A of less than 90°. Similarly, in the planar view, the other of the two straight lines L intersects with the extending direction of the slope surface 37-1 in the area associated with the other way along the longer side 99 where the outlet 42 is located at the angle A of less than 90°.

Although the side wall 37 in this embodiment includes the slope surfaces 37-1 at the two different positions, the side wall 37 does not overlap the semiconductor apparatus 70 in the planar view, as shown in FIG. 12. The semiconductor apparatus 70 may be arranged inside the side wall 37 in the planar view. In this manner, the coolant can efficiently cool the semiconductor apparatus 70 from the back surface of the semiconductor apparatus 70.

In this embodiment, at least a part of the side wall 37 facing the second coolant flow channel 30-2 in the area associated with the one way along the longer side 99 where the inlet 41 is located, that is, a part of the side wall 37 where the slope surface 37-1 is located has a positioning pin 38 in a surface facing the bottom plate 67. In this embodiment, similarly, a part of the side wall 37 where the other slope surface 37-1 is located has the pin 38.

In this embodiment, different from the bottom plate 64 in the cooling apparatus 10, the bottom plate 67 does not have the stepped portion 65 or the chamfered portion 66, but instead has a hole 68 to which the positioning pin 38 of the side wall 37 is fitted. Also, in this embodiment, the bottom plate 67 has two holes 68 corresponding to the two pins 38 formed in the side wall 37.

The position of the bottom plate 67 relative to the base plate 45 can be set by inserting the two respective pins 38 of the side wall 37 into the two respective holes 68 of the bottom plate 67. The quantity of the pairs of the pin 38 of the side wall 37 and the hole 68 of the bottom plate 67 may be more than two. A positioning hole may be formed in the part of the side wall 37 where the slope surface 37-1 is located instead of the pin 38. In this case, the bottom plate 67 may have a positioning pin which fits into the hole instead of the hole 68. Also, the side wall 37 and the bottom plate 67 may each have a combination thereof, for example, one pin and one hole.

In this embodiment, the side wall 37 and the bottom plate 67 are firmly fixed together with the fixing agent 98, the at least a part of the side wall 37 facing the second coolant flow channel 30-2 in the area associated with the one way along the longer side 99 where the inlet 41 is located, that is, the part of the side wall 37 where the slope surface 37-1 is located has a groove 39 for holding the fixing agent 98 in the surface facing the bottom plate 67. This can prevent the fixing agent 98 from overflowing into a region other than the interface between the side wall 37 and the bottom plate 67 to set.

As described above, for the cooling apparatus 11 of the semiconductor module 101 in this embodiment, the at least a part of the inner side of the side wall 37 facing the second coolant flow channel 30-2 is largely inclined inward compared to the inner side of the side wall 37 facing the first coolant flow channel 30-1, in the area associated with the one way along the longer side 99 where the inlet 41 is located in the planar view. With the semiconductor module 101 having the configuration, as shown in FIG. 10, even when the semiconductor module 101 is secured inside the vehicle 200 while being vertically placed, is supplied by the pump 221 with the coolant through the inlet 41 located on the upper side of the gravitational direction, and further the output of the pump 221 is small, accumulation of air within the coolant flow portion 92 can be prevented.

It is confirmed from the above-mentioned flow analysis conducted on the semiconductor module 101 that even if the flow rate of water supplied to the cooling apparatus 11 by the pump 221 is 5 (1/min), air is not accumulated within the coolant flow portion 92. It is also confirmed that thermal resistance values and amounts of pressure loss of the six respective semiconductor chips 78 can be maintained, compared to the semiconductor module 100 according to the above-mentioned embodiments. When the thermal resistance values of the respective six semiconductor chips 78 are maintained, it can mean distribution of thermal resistance among the six semiconductor chips 78 is not affected.

The cooling apparatus 11 of the semiconductor module 101 in this embodiment has the cooling pin fins 94 instead of plate fins. When the plate fins are provided instead of the pin fin, if clogging occurs between the plate fins, flow of a coolant comes to a stop at the occurrence point. In contrast, the cooling pin fins 94 provide more detour routes for the coolant than the plate fins. Therefore, with the semiconductor module 101, clogging among the cooling pin fins 94 is not likely to stop the flow of the coolant. In addition, the semiconductor module 101 can improve heat dissipation performance by about 10% compared to the semiconductor module including the plate fins because, for example, heat diffuses to the plurality of cooling pin fins 94.

Figure 13:
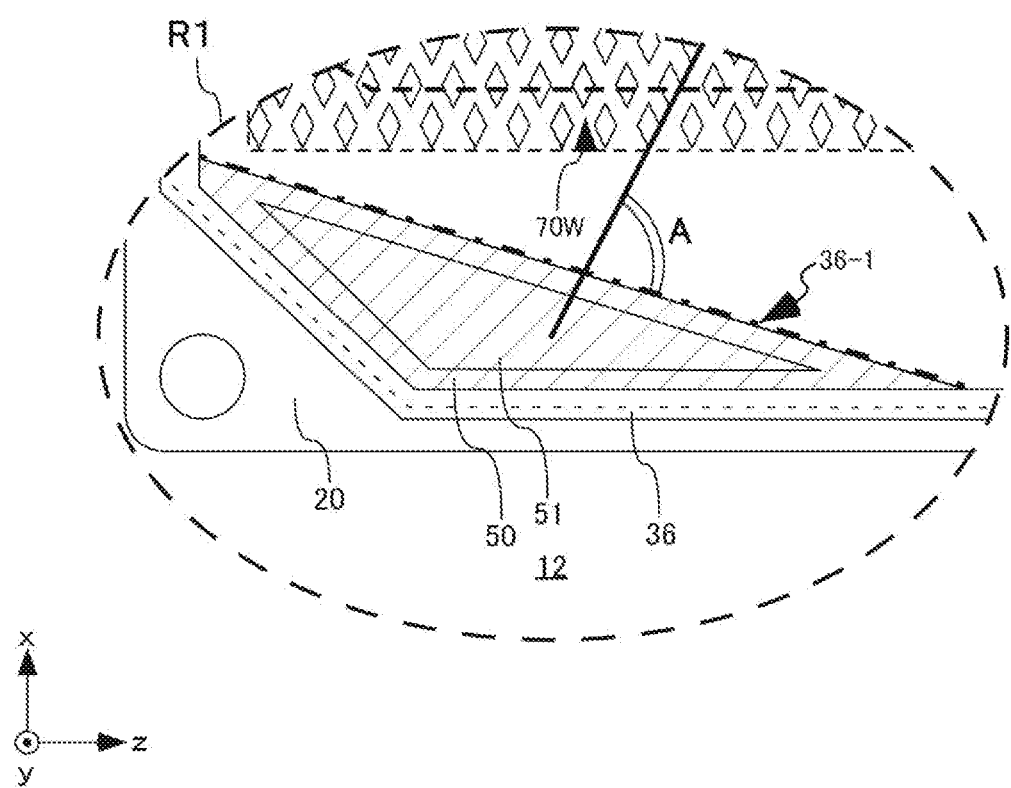
FIG. 13 is a diagram illustrating a first modification example of the side wall 37 in a region "R1" shown in FIG. 12.

FIG. 13 is a diagram illustrating a first modification example of the side wall 37 in a region "R1" shown in FIG. 12. The semiconductor module 101 in this embodiment may include a cooling apparatus 12 having the side wall 36 instead of the cooling apparatus 11 having the side wall 37. In this case, the profile of the side wall 36 is approximately symmetric along the shorter side 91 about the central axis extending along the longer side 99 in the planar view.

The side wall 36 has a slope portion 50 located in the area associated with the one way along the longer side 99 where the inlet 41 is located and facing the second coolant flow channel 30-2, and contacting an inner surface of the side wall 36. As at least a part of the inner side of the side wall 36 facing the second coolant flow channel 30-2, or as the slope surface 36-1, the inner side of the slope portion 50 is largely inclined inward compared to the inner side of the side wall 36 facing the first coolant flow channel 30-1. The semiconductor module 101 which is a modification example can achieve the effect similar to what the semiconductor module 101 according to the above-mentioned embodiments can achieve.

As described above, the side wall 36 is integrally formed with the top plate 20. On the other hand, the slope portion 50 is detachably fixed to the top plate 20. For example, the slope portion 50 and the top plate 20 may be brazed together. The height of the slope portion 50 along the y-axis is preferably the same as the height of the side wall 36 along the y-axis. The side wall 36 forms the profile of the side wall 36, and is an example of an outer wall surrounding the coolant flow portion 92.

As shown in FIG. 13, the slope portion 50 may have a groove 51 having the similar configuration and function to what the groove 39 has. In other words, the groove 51 can hold the fixing agent 98 in the surface facing the bottom plate 67.

Figure 14:
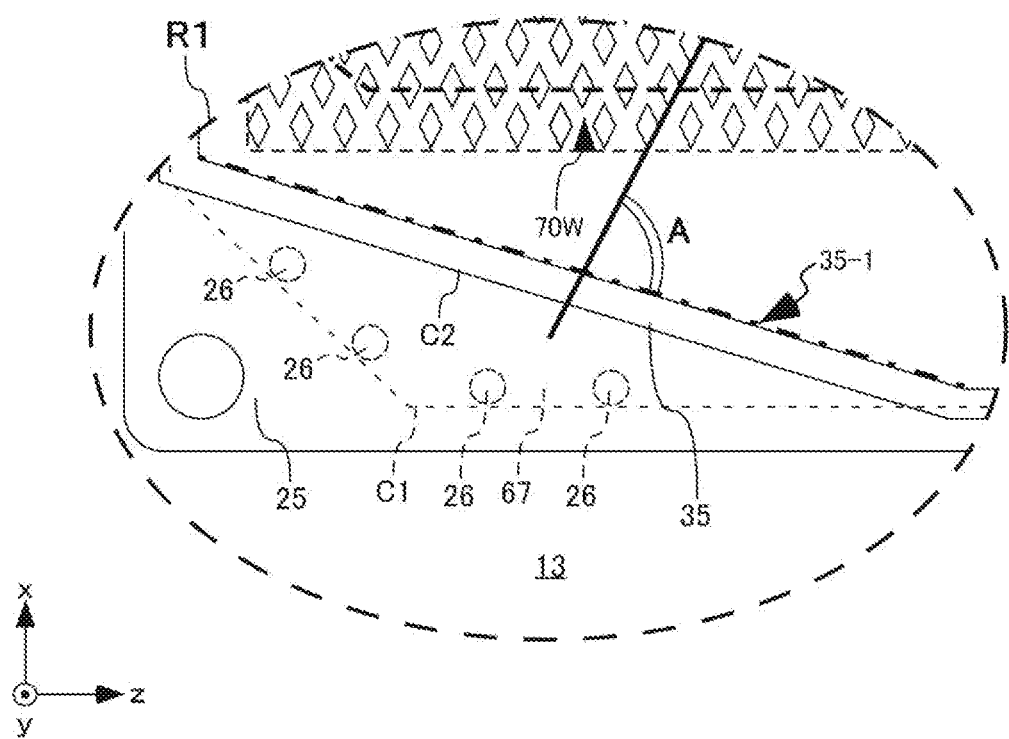
FIG. 14 is a diagram illustrating a second modification example of the side wall 37 in the region "R1" shown in FIG. 12.

FIG. 14 is a diagram illustrating a second modification example of the side wall 37 in the region "R1" shown in FIG. 12. The semiconductor module 101 in this embodiment may include a cooling apparatus 13 having a top plate 25 and a side wall 35 instead of the cooling apparatus 11 having the top plate 20 and the side wall 37.

The side wall 35 is integrally formed with the top plate 25, and the thickness of the side wall 35 is approximately uniform. Further, as shown in FIG. 14, a profile C 2 of at least a part of the side wall 35 facing the second coolant flow channel 30-2 is located inside relative to a profile C 1 of the bottom plate 67. In this manner, in the planar view, at least a part of the inner side of the side wall 35 facing the second coolant flow channel 30-2, or slope surface 35-1, is largely inclined inward compared to the inner side of the side wall 37 facing the first coolant flow channel 30-1 in an area associated with the one way along the longer side 99 where the inlet 41 is located. The semiconductor module 101 which is a modification example can achieve the effect similar to what the semiconductor module 101 according to the above-mentioned embodiments can achieve.

The top plate 25 may have a support pin 26 for supporting the bottom plate 67 outside the at least a part of the side wall 35 that faces the second coolant flow channel 30-2 and that is in the area associated with one way along the longer side 99 where the inlet 41 is located. In the example shown in FIG. 14, the top plate 25 has the four support pins 26 in the position. The side wall 35, the support pins 26 and the bottom plate 67 may be firmly fixed together with the fixing agent 98.

As shown in FIG. 10, the inlet pipe 222 and the outlet pipe 223 are fixed to the inlet 41 and the outlet 42. For the fixture, for example, rubber O-rings need to be attached to peripheries of the inlet 41 and the outlet 42, which are larger than the length of the peripheries. As such, the outline of the bottom plate 67 can be required to be maintained to have interfaces for the O-rings on the bottom plate 67.

With the cooling apparatus 13 of the semiconductor module 101 in this embodiment, inclusion of the above-mentioned configuration can cause the bottom plate 67 to be supported with the plurality of support pins 26 even if the above-mentioned O-rings are pressed against the bottom plate 67, and deformation of the bottom plate 67 can be prevented. For this purpose, the height of the support pins 26 along the y-axis is preferably the same as the height of the side wall 35 along the y-axis.

Figure 15:
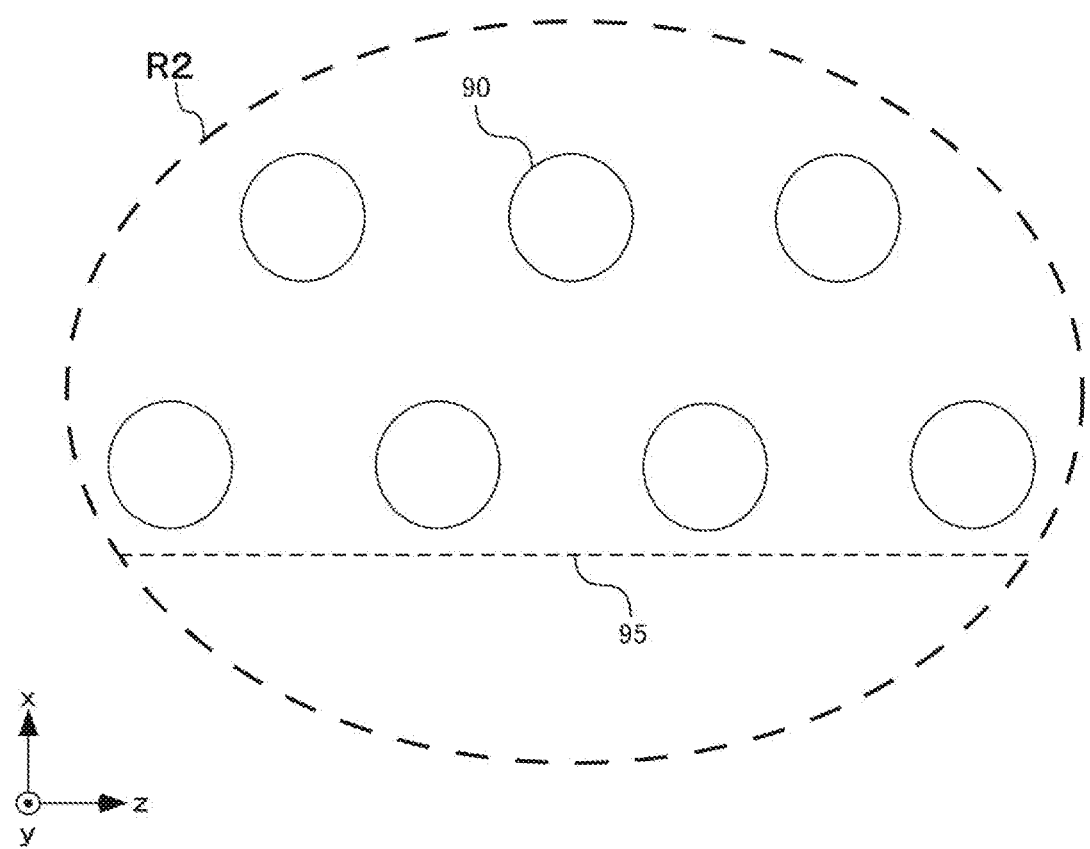
FIG. 15 is a diagram illustrating a modification example of cooling pin fins 94 in a region "R2" shown in FIG. 12.

FIG. 15 is a diagram illustrating a modification example of cooling pin fins 94 in a region "R2" shown in FIG. 12. For the embodiment shown in FIG. 12, the cooling pin fins 94 included in the fin region 95 has a substantially rhombic shape longer along the shorter side 91 than along the longer side 99 in the x-z plane cross section. As shown in FIG. 15, instead of the cross-sectional shape, the cooling pin fins 94 may have a cross section of round shape. Alternatively, the cooling pin fins 94 may have a cross section of oval shape.

For the two embodiments shown in FIG. 4 and FIG. 12, the insides defined by the side wall 36 of the cooling apparatus 10 and the side wall 37 of the cooling apparatus 11 may each have octagonal shape in the planar view. For both embodiments, in the coolant flow portion 92 defined by the side walls 36 and 37, the first coolant flow portion 30-1 is located in one section of the fin region 95 associated with one direction along the shorter side and the second coolant flow portion 30-2 is located in the other direction such that the channels are arranged in parallel, and the cooling pin fins 94 may be arranged between the first coolant flow portion 30-1 and the second coolant flow portion 30-2. Further, for both embodiments, the cooling pin fins 94 may be arranged in a lattice pattern, preferably in a diagonal or rhombus lattice pattern. For both embodiments, the inlet 41 and the outlet 42 may be adjacent to the fin region 95 in the coolant flow portion 92, and provided in a diagonally opposite manner. The openings of the inlet 41 and the outlet 42 may be longer along the longer side 99 than along the shorter side 91 in the planar view.

Figure 16:
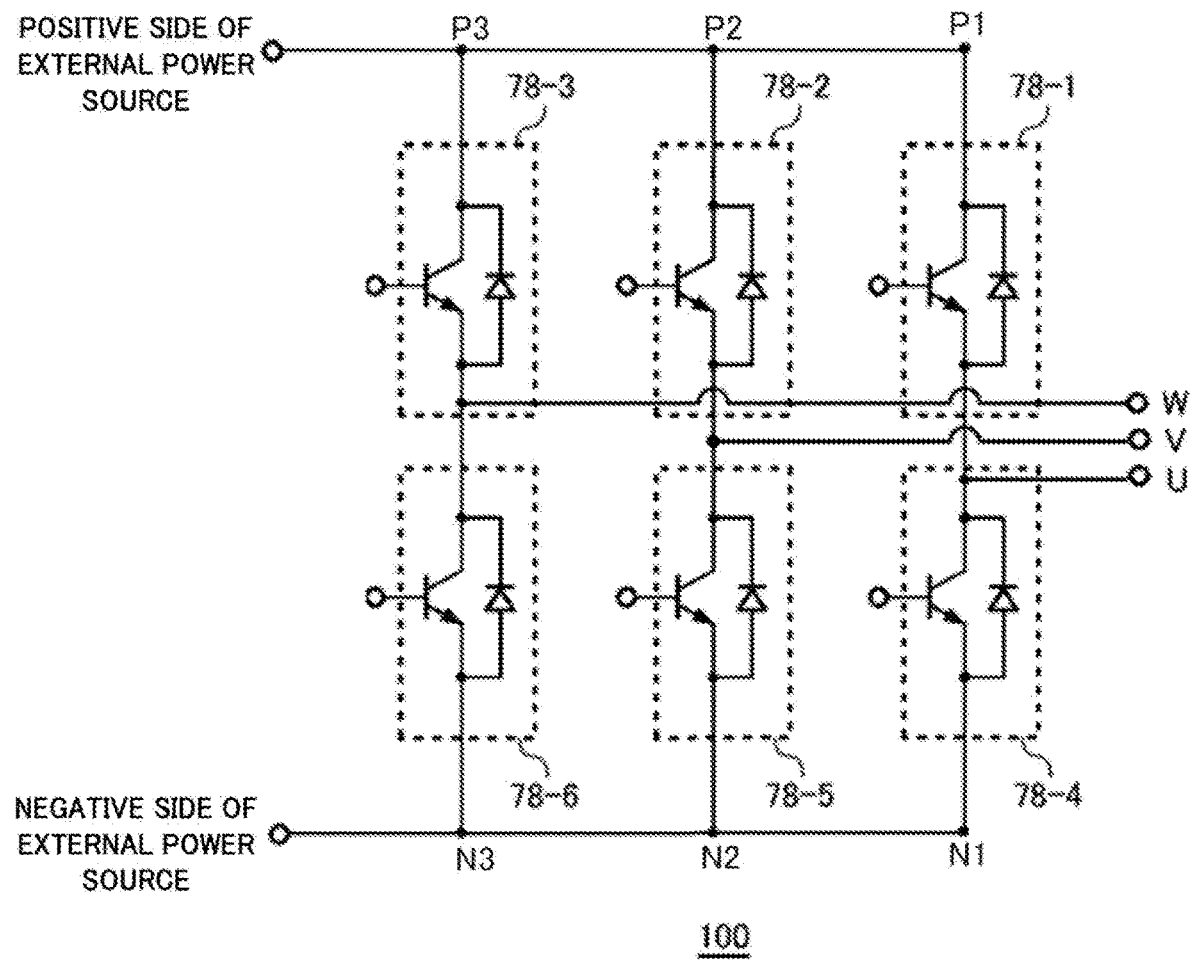
FIG. 16 is a main circuit diagram of the semiconductor modules 100, 101 according to one embodiment of the present invention.

FIG. 16 is a main circuit diagram of the semiconductor module 100, 101 according to a plurality of embodiments of the present invention. The semiconductor modules 100, 101 serve as a three-phase AC inverter circuit including output terminals U, V and W, and may be a part of an in-vehicle unit for driving a motor of a vehicle.

The semiconductor chips 78-1, 78-2 and 78-3 may constitute the upper arm and the semiconductor chips 78-4, 78-5 and 78-6 may constitute the lower arm of the semiconductor modules 100, 101. A pair of the semiconductor chips 78-1 and 78-4 may constitute a leg (U-phase). Similarly, a pair of the semiconductor chip 78-2 and 78-5 and a pair of the semiconductor chips 78-3 and 78-6 may constitute legs (V-phase, W-phase). The emitter electrode and the collector electrode of the semiconductor chip 78-4 may be electrically connected to an input terminal N1 and an output terminal U, respectively. The emitter electrode and the collector electrode of the semiconductor chip 78-1 may be electrically connected to the output terminal U and an input terminal P1, respectively. Similarly, the emitter electrode and the collector electrode of the semiconductor chip 78-5 may be electrically connected to an input terminal N2 and an output terminal V, respectively, and the emitter electrode and the collector electrode of the semiconductor chip 78-6 may be electrically connected to an input terminal N3 and an output terminal W, respectively. Further, the emitter electrode and the collector electrode of the semiconductor chip 78-2 may be electrically connected to the output terminal V and an input terminal P2, respectively, and the emitter electrode and the collector electrode of the semiconductor chip 78-3 may be electrically connected to the output terminal W and an input terminal P3, respectively.

Each of the semiconductor chips 78-1 to 78-6 may be alternately switched on and off by a signal input into the corresponding one of control terminals of the semiconductor chips 78-1 to 78-6. Each semiconductor chip 78 in this example may generate heat at the time of switching. The input terminals P1, P2, and P3 may be connected to the positive side of the external power source, the input terminals N1, N2, and N3 to the negative side of the external power source, and the output terminals U, V, and W to a load, respectively. The input terminals P1, P2, and P3 may be electrically connected to one another, and the other input terminals N1, N2, and N3 may be also electrically connected to one another.

The plurality of semiconductor chips 78-1 to 78-6 of the semiconductor modules 100, 101 may each be an RC-IGBT (Reverse Conducting IGBT) semiconductor chip. The semiconductor chips 78-1 to 78-6 may each include a combination of a transistor such as an MOSFET or an IGBT and a diode.

In the description of the plurality of above embodiments, particular states may be expressed using phrases "approximately", "substantially" or "about" such as, for example, "about the same", "approximately coincide", "approximately uniform", "approximately symmetric", "substantially rhombic". Any of them is intended to include not only a state which is exactly the particular state, but also a state which is generally the particular state.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

Although, for example, in the above-mentioned embodiments, the described configuration is the top plates 20, 25, the side walls 36, 37, 35, and the cooling pin fins 94 being formed integrally in the base plates 40, 45, the top plate 20 and the other, the side wall 36 and the others and the cooling pin fins 94 may alternatively be firmly fixed together with the fixing agent 98 or the like after each separately formed, the top plates 20 and the other and the side walls 36 and the others may be integrally formed and then the cooling pin fins 94 formed separately from them may be firmly fixed to the top plate 20 and the other, and the top plate 20 and the other and the cooling pin fins 94 may be integrally formed and then the side walls 36 and the others formed separately from them may be firmly fixed to the top plate 20 and the other.

Although, for example, in the above-mentioned embodiment, the described configuration is the cooling pin fins 94 being integrally formed with the top plates 20 and the other and extending toward the bottom plates 64, 67, the cooling pin fins 94 may alternatively be integrally formed with the bottom plates 64 and the other and may extend toward the top plate 20 and the other from the bottom plates 64 and the other. In this case, the ends of the cooling pin fins 94 and the top plate 20 and the other may be firmly fixed together with the fixing agent 98 or the like.

Although, for example, in the above-mentioned embodiments, the described configuration is the cooling pin fins 94 extending along the normal line of the principal surface of the top plate 20 between the top plate 20 and the other and the bottom plate 64, 67, that is, extending perpendicular to the top plate 20 and the other and the bottom plate 64 and the other, the cooling pin fins 94 may alternatively extend obliquely at an angle to the normal line of the principal surface of the top plate 20 and the other between the top plate 20 and the other and the bottom plate 64 and the other. The dimension of the x-y plane cross section of the cooling pin fins 94 may be constant or may change along the z-axis. As a more specific example, the cooling pin fins 94 may extend from either one of the top plate 20 and the other and the bottom plate 64 and the other to another such that the fins are tapered toward the end.

Although, for example, in the above-mentioned embodiments, the described configuration is the inlet 41 for letting the coolant into the coolant flow portion 92 and the outlet 42 for letting the coolant out of the coolant flow portion 92 being formed in the bottom plate 64, 67, the inlet 41 and the outlet 42 may alternatively be formed in the side wall 36, 37, 35. In this case, the inlet 41 and the outlet 42 may be formed in two side surfaces of the side walls 36 and the others that are opposite to each other along the x-axis.

Although, for example, in the above-mentioned embodiments, the described configuration is the semiconductor apparatus 70 being directly fixed to the upper surface 22 of the top plate 20 and the other of the cooling apparatus 10, 11, 12, 13, the semiconductor apparatus 70 may alternatively have a base plate exposed on the lower surface of the accommodating portion 72, the circuit board 76 may be fixed on an upper surface of the base plate, and the base plate may be fixed on the upper surface 22 of the top plate 20 and the other.

Although, for example, in the above-mentioned embodiments, the described configuration is the stepped portion 65 protruding from the principal surface of the bottom plate 64 and having a slightly small profile compared to the inner circumference of the side wall 36 in the planar view, the stepped portion 65 may alternatively be a cylindrical step formed around the outermost circumference of the bottom plate 64 in the planar view and protruding from the principal surface of the bottom plate 64. Another example of the stepped portion 65 may be a step formed around the outermost circumference of the bottom plate 64 on the planar view and recessed from the principal surface of the bottom plate 64. When the profile C1 of the bottom plate 64 is larger than the profile C2 of the side wall 36 in the planar view, the stepped portion 65 may be a groove which approximately coincides with the side wall 36 in the planar view and into which the lower end of the side wall 36 is fitted, and in this case, the chamfered portion 66 may not be formed in the bottom plate 64.

Although, for example, in the above-mentioned embodiments, the slope surface 35-1, 36-1, 37-1 of the side wall 35, 36, 37, the inner side of the slope portion 50, and the like are described as a straight line in the planar view, they are not limited to a straight line and may be a polygonal line or a curved line. For example, the slope surface 35-1 and the others may a curved line swelling in a bow-like manner toward the coolant flow portion 92, and may be a curved line dented in a bow-like manner away from the coolant flow portion 92, in the planar view.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10, 11, 12, 13: cooling apparatus, 20, 25: top plate, 21: fastening portion, 22: upper surface, 24: lower surface, 26: support pin, 30: coolant flow channel, 30-1: first coolant flow channel, 30-2: second coolant flow channel, 36, 37, 35: side wall, 35-1, 36-1, 37-1: slope surface, 37-2: non-slope surface, 38: pin, 39: groove, 40, 45: base plate, 41: inlet, 42: outlet, 50: slope portion, 51: groove, 64, 67: bottom plate, 65: stepped portion, 66: chamfered portion, 68: hole, 70: semiconductor apparatus, 70U: U-phase unit, 70V: V-phase unit, 70W: W-phase unit, 72: accommodating portion, 74: sealing portion, 76: circuit board, 78: semiconductor chip, 80: penetration hole, 92: coolant flow portion, 91: shorter side, 93: shorter side, 96: longer side, 94, 97: cooling pin fin, 95: fin region, 98: fixing agent, 99: longer side, 100, 101: semiconductor module, 200: vehicle, 210: control apparatus, 221: pump, 222: inlet pipe, 223: outlet pipe

What is claimed is:

1. A semiconductor module comprising a semiconductor apparatus and a cooling apparatus, wherein:

the semiconductor apparatus includes a semiconductor chip and a circuit board, the semiconductor chip being mounted on the circuit board; and the cooling apparatus includes:
- a top plate, the semiconductor apparatus being mounted on the top plate;
- a side wall connected to the top plate;
- a bottom plate connected to the side wall and facing the top plate;
- a coolant flow portion for causing a coolant to flow defined by the top plate, the side wall and the bottom plate, wherein a cross section of the coolant flow portion parallel to a principal surface of the top plate has a substantially rectangular shape with longer sides and shorter sides;
- an inlet in communication with a first section of the coolant flow portion associated with a first corner of the coolant flow portion and for letting the coolant into the coolant flow portion;
- an outlet in communication with a second section of the coolant flow portion associated with a second corner of the coolant flow portion and for letting the coolant out of the coolant flow portion;
- at least one cooling pin arranged in the coolant flow portion, extending between the top plate and the bottom plate, and having a substantially rhombic shape in a width-wise cross sectional area that is longer in an x-axis direction along the shorter sides of the coolant flow portion than in a y-axis direction along the longer sides of the coolant flow portion.

2. The semiconductor module according to claim 1, wherein:
the coolant flow portion has:
- a fin region having a plurality of the at least one cooling pin, a quantity of the plurality of the at least one cooling pin being greater in the y-axis direction than in the x-axis direction, the plurality of the at least one cooling pins being spaced apart in the coolant flow portion in a substantially rectangular shape longer along the longer sides of the coolant flow portion than along the shorter sides of the coolant flow portion;
- one communication region located at a greater position in the x-axis direction than the fin region to be in communication with the inlet, and extending along a first of the longer sides of the coolant flow portion; and
- another communication region located at an opposite greater position in the x-axis direction than the fin region to be in communication with the outlet, and extending along a second of the longer sides of the coolant flow portion.

3. The semiconductor module according to claim 2, wherein:
the top plate has a fastening portion located outside relative to the side wall for fastening to an external apparatus, and
a thickness of the fastening portion is greater than a thickness of the fin region in the top plate.

4. The semiconductor module according to claim 2, wherein
a thickness of the side wall is greater than a thickness of the fin region in the top plate.

5. The semiconductor module according to claim 1, wherein
the top plate, the side wall and the at least one cooling pin are integrally formed.

6. The semiconductor module according to claim 5, wherein
the bottom plate has a stepped portion for setting a position at which the side wall is firmly fixed and in contact with at least two different surfaces of the stepped portion.

7. The semiconductor module according to claim 6, wherein:
a thickness of the bottom plate is greater than both a thickness of the top plate and a thickness of the side wall; and
the inlet and the outlet are each formed in the bottom plate.

8. The semiconductor module according to claim 6, wherein:
the side wall and the bottom plate are firmly fixed with a fixing agent;
a profile of the bottom plate is located inside relative to a profile of the side wall; and
corners in the profile of the bottom plate that are firmly fixed to the side wall are chamfered to have a region for the fixing agent to form a fillet.

9. The semiconductor module according to claim 1, wherein
a length of each side of the substantially rhombic shape in the width-wise cross sectional area of the at least one cooling pin ranges from 1.8 mm to 2.0 mm, and each corner of the substantially rhombic shape in the width-wise cross sectional area is rounded with a curvature radius ranging from 0.1 mm to 0.2 mm.

10. The semiconductor module according to claim 9, wherein
first corners at opposite ends of the substantially rhombic shape in the width-wise cross sectional area of the at least one cooling pins in the x-axis direction are rounded with a larger curvature radius than second corners at opposite ends of the substantially rhombic shape in the width-wise cross sectional area of the at least one cooling pins in the y-axis direction.

11. A vehicle comprising the semiconductor module according to claim 1.

12. A manufacturing method of the semiconductor module according to claim 1, wherein
the top plate, the side wall and the at least one cooling pin are integrally formed out of a single continuous plate member.

13. The manufacturing method according to claim 12, wherein
the top plate, the side wall and the at least one cooling pin are integrally formed by performing on the plate member punching using molds corresponding to shapes of the top plate, the side wall and the at least one cooling pin.

14. A semiconductor module comprising a semiconductor apparatus and a cooling apparatus, wherein:
the semiconductor apparatus includes a semiconductor chip and a circuit board, the semiconductor chip being mounted on the circuit board; and
the cooling apparatus includes:
- a top plate, the semiconductor apparatus being mounted on the top plate in a region of a substantially rectangular shape with longer sides and shorter sides;
- a side wall connected to the top plate;
- a bottom plate connected to the side wall and facing the top plate;

a coolant flow portion for causing a coolant to flow defined by the top plate, the side wall and the bottom plate;
an inlet in communication with a first section of the coolant flow portion associated with a first corner of the coolant flow portion and for letting the coolant into the coolant flow portion;
an outlet located opposite to the inlet in a diagonal direction of a region in a planar view, in communication with a second section of the coolant flow portion associated with a second corner of the coolant flow portion and for letting coolant out of the coolant flow portion; and
at least one cooling pin arranged in the coolant flow portion, extending between the top plate and the bottom plate, and having a substantially rhombic shape in a width-wise cross sectional area that is longer in an x-axis direction along the shorter sides of the coolant flow portion than in a y-axis direction along the longer sides of the coolant flow portion, wherein
in the planar view, in an area along the longer sides of the coolant flow portion where the inlet is located, at least a part of an inner side of the side wall in the x-axis direction along the shorter sides of the coolant flow portion is largely inclined inward compared to an inner side of the side wall in the x-axis direction along the shorter sides of the coolant flow portion.

15. The semiconductor module according to claim 14, wherein
the side wall does not overlap the semiconductor apparatus in the planar view.

16. The semiconductor module according to claim 14, wherein:
a profile of the side wall is approximately symmetric along the shorter sides about a central axis extending along the longer sides in the planar view; and
in the area along the longer sides of the coolant flow portion where the inlet is located, a thickness of at least a part of the side wall in the x-axis direction is greater than a thickness of the side wall in the y-axis direction, so that the at least a part of the inner side of the side wall in the x-axis direction is largely inclined inward compared to the inner side of the side wall in the y-axis direction.

17. The semiconductor module according to claim 16, wherein
the at least a part of the side wall in the x-axis direction in the area along the longer sides of the coolant flow portion where the inlet is located has, in a surface facing the bottom plate, either of a positioning pin designed to fit into a positioning hole formed in the bottom plate and a positioning hole into which a positioning pin formed on the bottom plate is designed to fit.

18. The semiconductor module according to claim 16, wherein:
the side wall and the bottom plate are firmly fixed with a fixing agent; and
the at least a part of the side wall in the x-axis direction in the area along the longer sides where the inlet is located has a groove for holding the fixing agent in a surface facing the bottom plate.

19. The semiconductor module according to claim 14, wherein:
a profile of the side wall is approximately symmetric along the shorter sides of the coolant flow portion about a central axis extending along the longer sides of the coolant flow portion in the planar view;
the side wall has:
an outer wall forming the profile and surrounding the coolant flow portion; and
a slope portion located in the x-axis direction in the area along the longer sides of the coolant flow portion where the inlet is located and contacting an inner surface of the outer wall; and
as the at least a part of the inner side of the side wall in the x-axis direction, an inner side of the slope portion is largely inclined inward compared to an inner side of the outer wall in the y-axis direction.

20. The semiconductor module according to claim 19, wherein:
the outer wall is integrally formed with the top plate; and
the slope portion is detachably fixed to the top plate.

21. The semiconductor module according to claim 14, wherein:
the side wall is integrally formed with the top plate;
a thickness of the side wall is approximately uniform;
a profile of at least a part of the side wall in the x-axis direction is located inside relative to a profile of the bottom plate;
the top plate has a support pin for supporting the bottom plate outside the at least a part of the side wall in the x-axis direction in an area along the longer sides of the coolant flow portion where the inlet is located; and
the side wall and the support pin are firmly fixed to the bottom plate with a fixing agent.

22. The semiconductor module according to claim 14, wherein
the coolant flow portion includes:
a fin region having a plurality of the at least one cooling pin, a quantity of the plurality of the at least one cooling pin being greater in the y-axis direction than in the x-axis direction, the plurality of the at least one cooling pin being spaced apart in the coolant flow portion in a substantially rectangular shape longer along the longer sides of the coolant flow portion than along the shorter sides of the coolant flow portion;
one communication region located at a greater position in the x-axis direction than the fin region to be in communication with the inlet, and extending along a first of the longer sides of the coolant flow portion; and
another communication region located at an opposite greater position in the x-axis direction than the fin region to be in communication with the outlet, and extending along a second of the longer sides of the coolant flow portion.

23. The semiconductor module according to claim 22, wherein:
in the planar view, one side of each of the plurality of the at least one cooling pin extend along an imaginary straight line in the diagonal direction, the imaginary straight line extending between an area along the longer sides of the coolant flow portion where the outlet is located and along the shorter sides of the coolant flow portion and an area along the longer sides of the coolant flow portion where the inlet is located and along the shorter sides of the coolant flow portion intersects, at an angle of less than 90°, with an extending direction of the at least a part of an inner side of the side wall in the y-axis direction in an area associated with the x-axis direction along the longer sides of the coolant flow portion where the inlet is located.

24. The semiconductor module according to claim 14, wherein:
a thickness of the bottom plate is greater than both a thickness of the top plate and a thickness of the side wall; and
the inlet and the outlet are each formed in the bottom plate.

25. A vehicle comprising:
the semiconductor module according to claim 14; and
a pump for letting the coolant into the coolant flow portion through the inlet and letting the coolant out of the coolant flow portion through the outlet of the semiconductor module, wherein
the semiconductor module is secured inside the vehicle with the inlet placed on an upper side of a gravitational direction and the outlet placed on a lower side of a gravitational direction.

26. A semiconductor module comprising a semiconductor apparatus and a cooling apparatus, wherein:
the semiconductor apparatus includes a semiconductor chip and a circuit board, the semiconductor chip being mounted on the circuit board; and
the cooling apparatus includes:
a top plate, the semiconductor apparatus being mounted on the top plate;
a side wall connected to the top plate;
a bottom plate connected to the side wall and facing the top plate;
a coolant flow portion for causing a coolant to flow defined by the top plate, the side wall and the bottom plate, wherein a cross section of the coolant flow portion parallel to a principal surface of the top plate has a substantially rectangular shape with longer sides and shorter sides;
an inlet in communication with a first section of the coolant flow portion associated with a first corner of the coolant flow portion and for letting the coolant into the coolant flow portion;
an outlet in communication with a second section of the coolant flow portion associated with a second corner of the coolant flow portion and for letting the coolant out of the coolant flow portion; and
a cooling pin fin arranged in the coolant flow portion, extending between the top plate and the bottom plate, and having a substantially rhombic shape longer along the shorter sides than along the longer sides, wherein
the top plate, the side wall and the cooling pin fin are integrally formed, and
the bottom plate has a stepped portion for setting a position at which the side wall is firmly fixed and in contact with at least two different surfaces of the side wall.

27. The semiconductor module according to claim 26, wherein:
a thickness of the bottom plate is greater than both the thickness of the top plate and the thickness of the side wall; and
the inlet and the outlet are each formed in the bottom plate.

28. The semiconductor module according to claim 26, wherein:
the side wall and the bottom plate are firmly fixed with a fixing agent;
a profile of the bottom plate is located inside relative to a profile of the side wall; and
corners in the profile of the bottom plate that are firmly fixed to the side wall are chamfered to have a region for the fixing agent to form a fillet.

29. A semiconductor module comprising a semiconductor apparatus and a cooling apparatus, wherein:
the semiconductor apparatus includes a semiconductor chip and a circuit board, the semiconductor chip being mounted on the circuit board; and
the cooling apparatus includes:
a top plate, the semiconductor apparatus being mounted on the top plate in a region of a substantially rectangular shape with longer sides and shorter sides;
a side wall connected to the top plate;
a bottom plate connected to the side wall and facing the top plate;
a coolant flow portion for causing a coolant to flow defined by the top plate, the side wall and the bottom plate;
an inlet in communication with a first section of the coolant flow portion associated with a first corner of the coolant flow portion and for letting the coolant into the coolant flow portion;
an outlet located opposite to the inlet in a diagonal direction of the region in a planar view, in communication with a second section of the coolant flow portion associated with a second corner of the coolant flow portion diagonally opposite the first corner and for letting the coolant out of the coolant flow portion;
first and second angled portions in third and fourth corners of the coolant flow portion to deflect coolant at least in part toward the bottom plate; and
a cooling pin fin arranged in the coolant flow portion and extending between the top plate and the bottom plate, and having a substantially rhombic shape longer along the shorter sides than along the longer sides, wherein
in the planar view, in an area along the longer sides where the inlet is located, at least a part of an inner side of the side wall in the x-axis direction along the shorter sides is largely inclined inward compared to an inner side of the side wall in the x-axis direction along the shorter sides, and
the coolant flow portion includes:
a fin region having a plurality of the cooling pin fin, a quantity of the plurality of the cooling pin fin being greater along the longer sides than along the shorter sides, and having a substantially rectangular shape longer along the longer sides than along the shorter sides;
one communication region located at a greater position in the x-axis direction than the fin region to be in communication with the inlet, and extending along a first of the longer sides; and
another communication region located at an opposite greater position in the x-axis direction than the fin region to be in communication with the outlet, and extending along a second of the longer sides.

30. A semiconductor module comprising a semiconductor apparatus and a cooling apparatus, wherein:
the semiconductor apparatus includes a semiconductor chip and a circuit board, the semiconductor chip being mounted on the circuit board; and
the cooling apparatus includes:

a top plate, the semiconductor apparatus being mounted on the top plate in a region of a substantially rectangular shape with longer sides and shorter sides;

a side wall connected to the top plate;

a bottom plate connected to the side wall and facing the top plate;

a coolant flow portion for causing a coolant to flow defined by the top plate, the side wall and the bottom plate;

an inlet in communication with a first section of the coolant flow portion associated with a first corner of the coolant flow portion and for letting the coolant into the coolant flow portion;

an outlet located opposite to the inlet in a diagonal direction of the region in a planar view, in communication with a second section of the coolant flow portion associated with a second corner of the coolant flow portion and for letting the coolant out of the coolant flow portion; and a cooling pin fin arranged in the coolant flow portion and extending between the top plate and the bottom plate, wherein in the planar view, in an area along the longer sides where the inlet is located, at least a part of an inner side of the side wall in the y-axis direction along the shorter sides is largely inclined inward compared to an inner side of the side wall in the x-axis direction along the shorter sides, in the planar view, a plurality of cooling pin fins, the plurality of cooling pin fins including the cooling pin fin, have a substantially rhombic shape longer along the shorter sides than along the longer sides, and one side of each of the plurality of cooling pin fins extend along an imaginary straight line in the diagonal direction; and in the planar view, the imaginary straight line extending between an area along the longer sides where the outlet is located and associated with the x-axis direction along the shorter sides and an area along the longer sides where the inlet is located and along the shorter sides intersects, at an angle of less than 90°, with an extending direction of the at least a part of an inner side of the side wall in the y-axis direction in an area along the longer sides where the inlet is located.

31. A semiconductor module comprising a semiconductor apparatus and a cooling apparatus, wherein:

the semiconductor apparatus includes a semiconductor chip and a circuit board, the semiconductor chip being mounted on the circuit board; and the cooling apparatus includes:

a top plate, the semiconductor apparatus being mounted on the top plate;

a side wall connected to the top plate;

a bottom plate connected to the side wall and facing the top plate;

a coolant flow portion for causing a coolant to flow defined by the top plate, the side wall and the bottom plate, wherein a cross section of the coolant flow portion parallel to a principal surface of the top plate has a substantially rectangular shape with longer sides and shorter sides;

an inlet in communication with a first section of the coolant flow portion associated with a first corner of the coolant flow portion and for letting the coolant into the coolant flow portion;

an outlet in communication with a second section of the coolant flow portion associated with a second corner of the coolant flow portion diagonally opposite the first corner and for letting the coolant out of the coolant flow portion;

at least one cooling pin arranged in the coolant flow portion, extending between the top plate and the bottom plate, and having a substantially rhombic shape in a width-wise cross sectional area that is longer in an x-axis direction along the shorter sides of the coolant flow portion than in a y-axis direction along the longer sides of the coolant flow portion, and first and second angled portions in third and fourth corners of the coolant flow portion to deflect coolant at least in part toward the bottom plate.

* * * * *